United States Patent [19]

Sanger

[11] Patent Number: 5,157,775
[45] Date of Patent: Oct. 20, 1992

[54] DUAL PORT, DUAL SPEED IMAGE MEMORY ACCESS ARRANGEMENT

[75] Inventor: Kurt M. Sanger, Rochester, N.Y.

[73] Assignee: Eastman Kodak Company, Rochester, N.Y.

[21] Appl. No.: 451,398

[22] Filed: Dec. 15, 1989

[51] Int. Cl.⁵ .............................. G06F 13/00
[52] U.S. Cl. .................. 395/425; 365/230.05;
364/239.1; 364/DIG. 1; 364/964.31;
364/965.9; 364/DIG. 2
[58] Field of Search .................. 364/200, 900;
365/230.05; 395/425

[56] References Cited

U.S. PATENT DOCUMENTS

| | | | |
|---|---|---|---|
| 4,435,792 | 3/1984 | Bechtolsheim | 365/230 |
| 4,597,061 | 6/1986 | Cline et al. | 365/189 |
| 4,631,692 | 12/1986 | Broedner | 364/518 |
| 4,646,270 | 2/1987 | Voss | 365/230 |
| 4,663,735 | 5/1987 | Novak et al. | 364/900 |
| 4,665,495 | 5/1987 | Thaden | 364/900 X |
| 4,789,960 | 12/1988 | Willis | 364/900 |
| 4,794,464 | 12/1988 | Sasson | 358/310 |
| 4,821,226 | 4/1989 | Christopher et al. | 364/900 |
| 4,845,661 | 7/1989 | Shimada | 364/900 |
| 4,870,621 | 9/1989 | Nakada | 365/230.05 |
| 4,905,189 | 2/1990 | Brunolli | 364/900 |
| 4,987,559 | 1/1991 | Miyauchi et al. | 365/230.05 X |

Primary Examiner—Michael R. Fleming
Assistant Examiner—Glenn A. Auve
Attorney, Agent, or Firm—Robert L. Randall

[57] ABSTRACT

A dual port, dual speed image memory interface is capable of controllably inputting or outputting medium speed serial data through a medium speed port at the same time that high speed serial imagery data is being supplied to or read from a high speed data rate port. Access to the medium speed port is through a mux/demux unit, which is coupled to receive imagery data at the medium data rate and controllably writes successive data signals, in parallel, into respective ones of a set of plural memory units, and controllably reads out data from the parallel-connected memory units and assembles the accessed data in the form of a serial output digital data stream for transmission to a requesting destination device signals at the medium data rate. Access to the high speed port is through a high data rate shift register, which is coupled to receive high speed imagery data and controllably transfers successive pixel signals, in parallel, to the input stage of each internal shift registers that are coupled to respective row access ports of the plurality of parallel-connected memory units. During high speed read out successive rows of memory data are transferred from the internal shift registers into a respective stage of the high data rate shift register, which is then serially clocked for high speed readout.

28 Claims, 25 Drawing Sheets

DUAL PORT, DUAL SPEED IMAGE MEMORY ACCESS ARRANGEMENT

FIELD OF THE INVENTION

The present invention relates in general to imagery data processing and is particularly directed to a memory interface for effecting differential speed storage and retrieval of digital imagery data, so that, as the contents of an image memory (video dynamic random access memory) are being read out at a first (e.g. high speed) data rate, a new image may be written into memory at a second (e.g. medium speed) data rate.

BACKGROUND OF THE INVENTION

Imagery data processing systems often require that a stored image be accessed and displayed at the same time that a new image is being received. Moreover, the data rate of incoming digital data from a source of imagery signals is not always the same as the data rate of a destination device. For example, captured imagery data from a 20 Hz, Mega-Pixel camera may be used to drive a 60 Hz, high resolution monitor. Similarly, writing imagery data obtained from a four-minute scan of a 2 k pixel by 3 k line scan of 35 mm film onto a high resolution video device, such as an HDTV screen, requires the frame rate to be increased to one-thirtieth of a second. A system which converts between PAL and NTSC television standards (requiring a change in frame rate from 50 to 60 Hz) is yet another example of where the differential data rate problem exists.

Conventionally these problems have been addressed by switching between a pair of image memory buffers, and blanking the destination monitor while the next (incoming) image is being recorded. Namely, an additional or redundant storage facility is employed, or the transfer of the contents of the image memory to a display device is inhibited until loading of the new image is complete. These mechanisms neither provide for the loading of a new image in memory during the same time that a continuous output is being supplied to a destination (display) device, nor do they handle differential data rates for destination and source.

SUMMARY OF THE INVENTION

In accordance with the present invention, the ability to read out and update an image memory, either contemporaneously or at different times and at either the same or different data rates, is accomplished by means of a dual port memory interface that is capable of controllably inputting or outputting medium speed serial imagery data through a first, medium speed port at the same time that high speed serial imagery data is being supplied to or read from a second, high speed data rate port. For this purpose, the present invention is incorporated with each of the ports of a multiplicity of (e.g. sixteen) parallel-connected, dual port video dynamic random access memory units for each bit of resolution of the imagery data. For an eight bit resolution image, there would be eight times the multiplicity (e.g. 8×16=128) such memory units and associated interface capacity. A first (medium data rate) port of each memory unit provides selective access to any storage location, on an individual basis. Access to the medium speed port is effected in accordance with the interface arrangement of the present invention by means of a medium data rate mux/demux unit (multiplexer, demultiplexer), which is coupled to receive a serial data stream of digital imagery signals at the medium data rate and controllably writes successive ones of prescribed pluralities (e.g. digital data signals (bits) representative of a sequence of sixteen pixels), in parallel, into respective ones of the memory units, and controllably reads out digital data signals from the parallel-connected memory units and assembles the accessed data in the form of a serial output digital data stream for transmission to a requesting destination device signals at the medium data rate.

The mux/demux unit includes a temporary input buffer into successive storage locations of which successive pixel signals of a medium data rate imagery data stream are serially loaded during a medium speed write mode of operation. The buffered data is then transferred, in parallel, into storage locations of respective ones of the plurality of parallel-connected memory units. For effecting medium speed read-out, the mux/demux unit includes a temporary output buffer into respective storage locations of which imagery data is transferred in parallel from storage locations of respective ones of the plurality of parallel-connected memory units. The contents of the temporary output buffer are then serially clocked out as a medium data rate output imagery signal stream.

Access to the high speed port is effected by means of a high data rate shift register, which is coupled to receive a serial data stream of digital imagery signals at the high speed data rate and controllably transfers successive ones of prescribed sets (e.g. sixteen pixel signals), in parallel, to the input stage of each of the internal shift registers that are coupled to respective row access ports of the plurality of parallel-connected memory units. As each successive set of pixel signals is received and transferred to the internal shift registers of the memory units, the contents of the successive stages of those shift registers are shifted. Because the total capacity of the internal shift registers (e.g. 16 registers×256 bits/register) exceeds the number of pixels per line, this process continues until a plurality of lines of imagery data have been captured. The contents of the internal shift register are then transferred into a row of memory. Successive lines of imagery data are processed in this manner to store an entire frame.

High speed read out is accomplished by transferring the contents of successive rows of the memory array (and thereby multiple lines of the image frame) to the internal shift registers and shifting the contents of the internal shift register of each memory unit, a bit at a time, into a respective stage of the high data rate shift register. The contents of the high data rate shift register are then clocked out at the high data rate as a serial output digital data stream.

Each of the medium data rate mux/demux unit and the high data rate shift register is driven by an associated controller such that the mux/demux unit controllably interfaces medium data rate imagery signals with the memory array during every other memory cycle (that are reserved for medium speed access). The alternate memory cycles that are interleaved with those reserved for medium speed access are used for memory-/internal shift register transfers (at the end of a line, multiple lines, or a frame of high speed data) as part of the high data rate access mechanism and for internal housekeeping. Because of this dual port, dual speed capability of the interface mechanism of the present invention, imagery data may be read into memory at one speed while it is being clocked out at another speed and at either of the medium or high data rates, regardless of the data rate at which imagery data was originally coupled to the memory.

DETAILED DESCRIPTION

Figure 1:
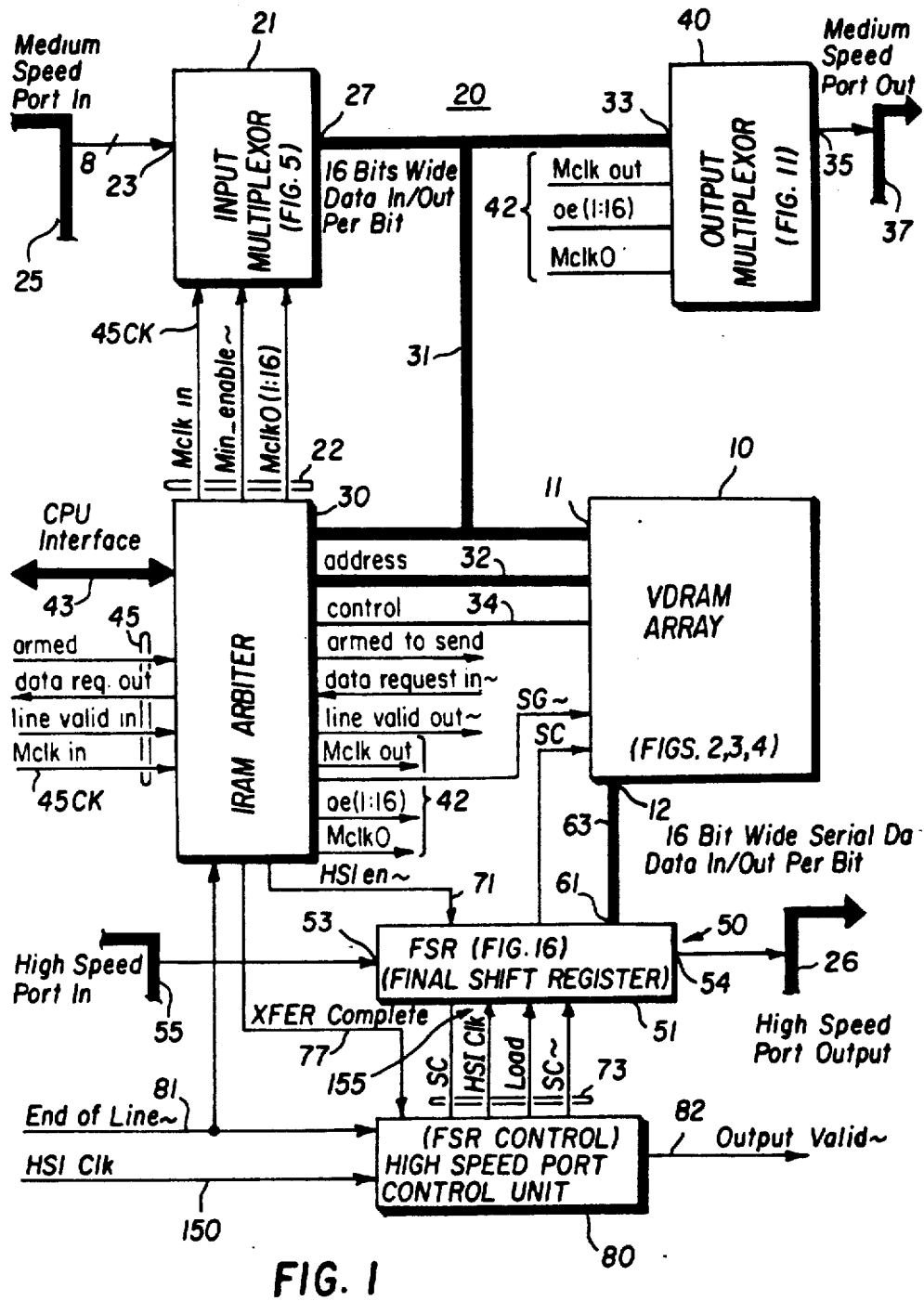
FIG. 1 is a diagrammatic illustration of the overall architecture of a preferred embodiment of the dual port differential speed imagery storage and retrieval system in accordance with the present invention.

Before describing in detail the particular improved differential speed imagery storage and retrieval system in accordance with the present invention, it should be observed that the present invention resides primarily in a novel structural combination of conventional data processing circuits and components and not in the particular detailed configurations thereof. Accordingly, the structure, control and arrangement of these conventional circuits and components have been illustrated in the drawings by readily understandable block diagrams which show only those specific details that are pertinent to the present invention, so as not to obscure the disclosure with structural details which will be readily apparent to those skilled in the art having the benefit of the description herein. Thus, the block diagram illustrations of the Figures do not necessarily represent the mechanical structural arrangement of the exemplary system, but are primarily intended to illustrate the major structural components of the system in a convenient functional grouping, whereby the present invention may be more readily understood.

Figure 2:
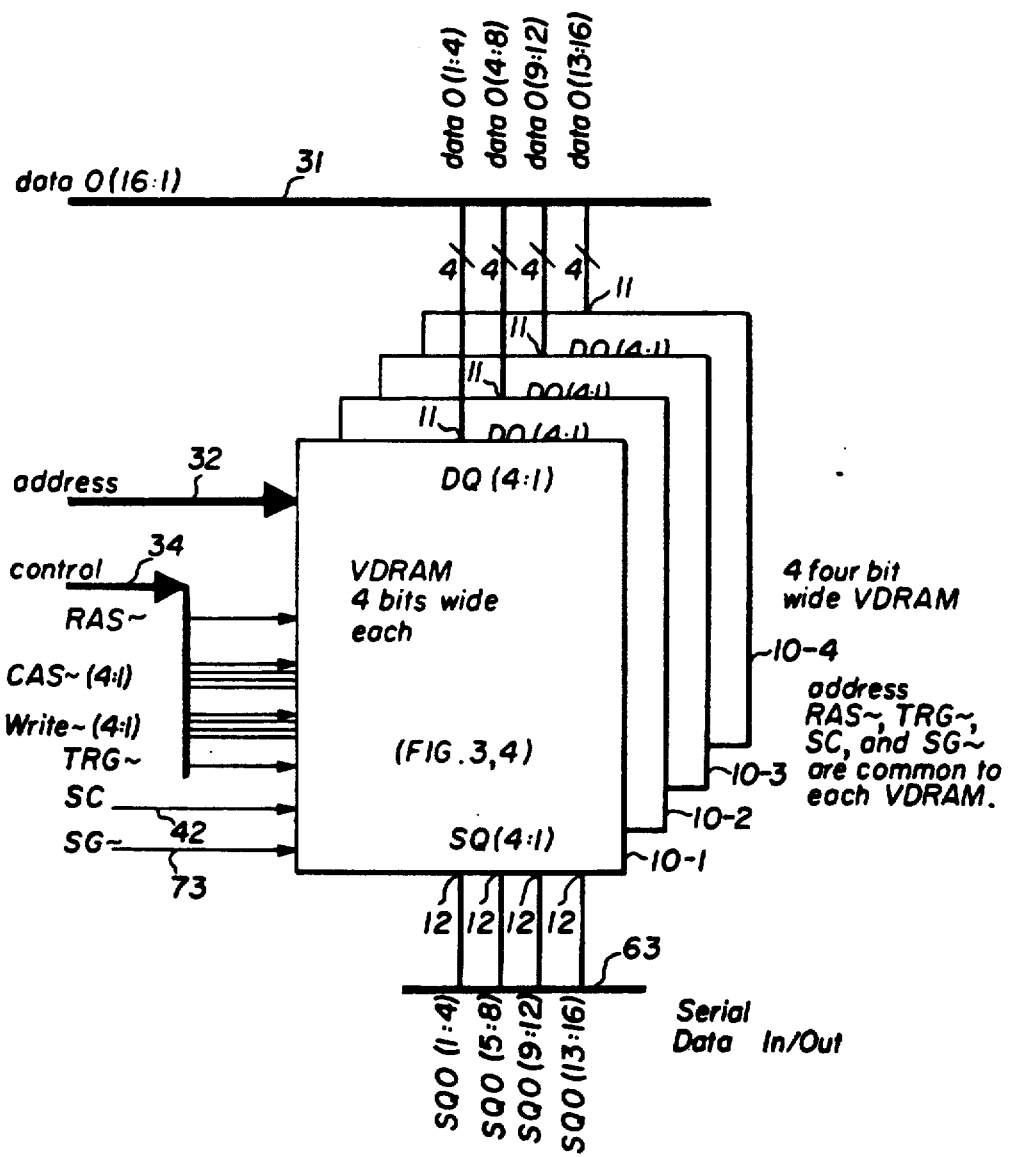
FIG. 2 shows an arrangement of four multiport memory array packages employed in the video dynamic memory array of FIG. 1.

Referring now to FIG. 1, a preferred embodiment of the dual port differential speed imagery storage and retrieval system in accordance with the present invention is diagrammatically shown as comprising a dual port (imagery data) memory array 10 having first and second bidirectional data ports 11 and 12, respectively. As shown in FIG. 2, memory array 10 is preferably comprised of an array of (four) multiport video dynamic random access memory packages (such as Texas Instrument TMS4461 memory packages) 10-1, 10-2, 10-3 and 10-4, each of which, in turn, contains an integrated parallel set (e.g. four) of (64K × 1) dual port memories units, to yield a total of sixteen individual memory units within array 11. The make-up of one of these memory packages is diagrammatically illustrated in FIG. 3, while FIG. 4 shows an individual memory unit and its attendant interface circuitry. Each individual memory unit is associated with a respective pixel signal of a prescribed number of pixel signals within a line of imagery data to be stored and retrieved. Thus, in the present example, where the memory array contains sixteen memory units, for each bit of resolution of a respective pixel within a frame of imagery data, an incoming serial data stream will be subdivided in successive contiguous groups of sixteen signals each, for storage into memory. Conversely, data is accessed from the sixteen memory units in parallel groups of sixteen, which are then transmitted as successive, contiguous groups to form a serial output data stream. (It should be observed that the invention is not limited to a particular resolution (e.g. eight bits per pixel) or to a set of sixteen data values per sequence employed in the example given here. These exemplary values are merely for purposes of providing a practical illustration of the invention.)

Input port 11 forms a medium speed or medium data rate (e.g. up to 40 MHz) port of memory array 10 and is coupled to a mux/demux interface unit 20 through which serially formatted, medium speed imagery data is written into and read out from the image memory. Interface unit 20 includes an input multiplexer 21 having a serial input port 23 which is coupled to an (eight bit wide) input link 25 over which a medium data rate serial data stream (imagery data frame) is coupled from an imagery data input device, such as a Mega Pixel camera.

Multiplexer 21 has a parallel output port 27 coupled to an (8×16 bit wide) interface link 31. Link 31 is coupled to medium speed input port 11 of memory array 10, a control arbiter 30 and to the parallel input port 33 of an output demultiplexer 40. A serial output port 35 of demultiplexer 40 is coupled to an (eight bit wide) output link 37 for coupling imagery data, that has been read out from memory, as a medium speed serial data stream to a downstream requesting device (e.g. color display monitor). Each of multiplexer 21 and demultiplexer 40 is coupled to arbiter 30 by way of a respective set of dedicated control links 22 and 42, the details of which will be described below with reference to FIGS. 5-15. Arbiter 30, which may be comprised of combinational logic and an associated state machine, supervises the overall operation and timing of the various components of the memory architecture. Arbiter 30 is coupled to a local processor interface 43 and to a communication link 45 through which an associated imagery signal input/output device (e.g. camera, display) communicates with the arbiter to initiate and terminate a transfer of medium speed serial imagery data. It also supplies and increments the addresses for storage and retrieval of data and supplies address and control signals through respective address and control links 32 and 34 to memory array 10.

Input port 12 forms the high speed port of memory array 10 and is coupled to a high speed interface unit 50 through which serially formatted, high speed (e.g. up to 400 MHz) imagery data is written into and read out from the image memory. Unit 50 includes a (sixteen stage) high speed 'final' shift register 51 having a serial input port 53 which is coupled to an (eight bit wide) input link 55 over which a high data rate serial data stream is coupled from an input device. Shift register 51 has a serial output port 57 coupled via link 56 to a downstream requesting device and a parallel port 61 coupled via an (8×16 bit wide) interface link 63 to port 12 of array 10, for coupling the respective stages of final shift register 51 to respective bidirectional serial drivers of the internal data shift registers of the sixteen memory units within memory array 10. Final shift register 51 is further coupled to a high speed clock enable link 71 from arbiter 30 and to a set of dedicated control links 73 from a high speed port control unit 80. As will be described in detail below with reference to the timing diagrams of FIGS. 17-26, high speed control unit 80, which may comprise a state machine, supervises the operation and timing of high speed shift register 51 for both high speed write and high speed read operations. Control unit 80 is coupled to arbiter 30 via a (transfer complete) link 77 and to a communication link 81, through which an associated imagery signal input/output device requests a high speed data read out and indicates that high speed data is being supplied for storage in memory.

As described briefly above, in the present example, memory array 10 is comprised of an array of four multi (dual) port video dynamic random access memory packages, each package containing an integrated parallel set of four of 64K×1 dual port memories units. As noted above block diagrams (as supplied by the manufacturer) of an individual package and one of the four dual port memory units contained within a package are shown in FIGS. 3 and 4, respectively, and reference may be had to documentation supplied by the manufacturer for a detailed discussion of the components and the associated signalling parameters for their operation.

For purposes of the present description, the manner in which the internal circuitry of a respective memory unit within the array is interfaced with other components of the system will be briefly addressed.

As noted previously, each individual memory unit shown in FIG. 3 is associated with a respective pixel signal of a prescribed number (here sixteen) of pixel signals within a line of imagery data to be stored and retrieved. Consequently, since memory array 10 contains sixteen of these memory units, an incoming serial digital data stream that is associated with a particular bit of some number of bits of resolution (e.g. eight bits wide) of a respective pixel within a frame of imagery data will be subdivided in successive contiguous groups of sixteen digital values (binary bits) per group, each subdivided bit being stored in a respective memory unit diagrammatically depicted in FIG. 3. Similarly, data bits are accessed (in parallel) from the sixteen memory units of the array and assembled as successive, contiguous groups of sixteen to form a serial output data stream for transmission to a requesting imagery processing device.

Figure 3:
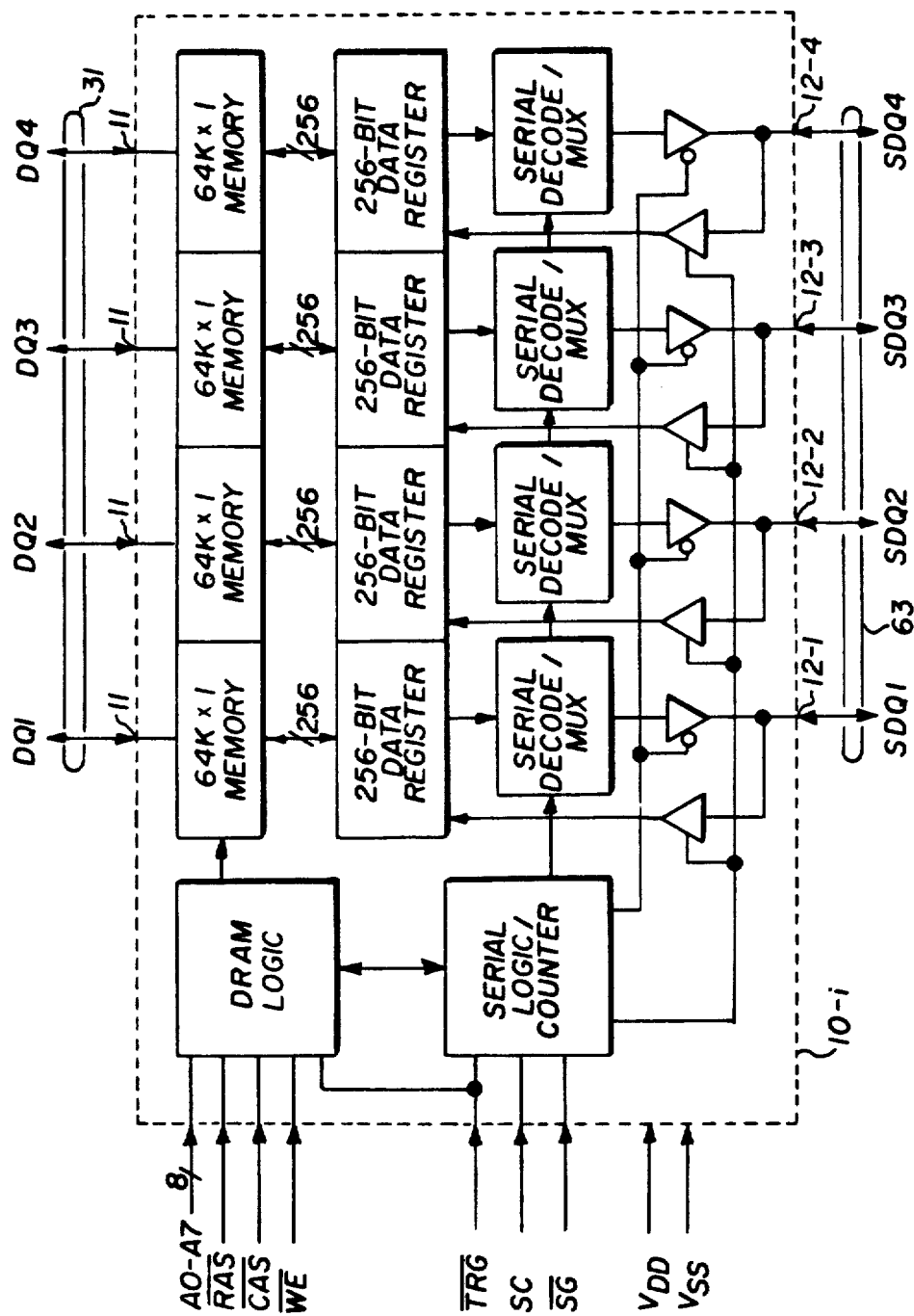
FIG. 3 diagrammatically shows the make-up of an individual one of the memory packages of FIG. 2.
Figure 4:
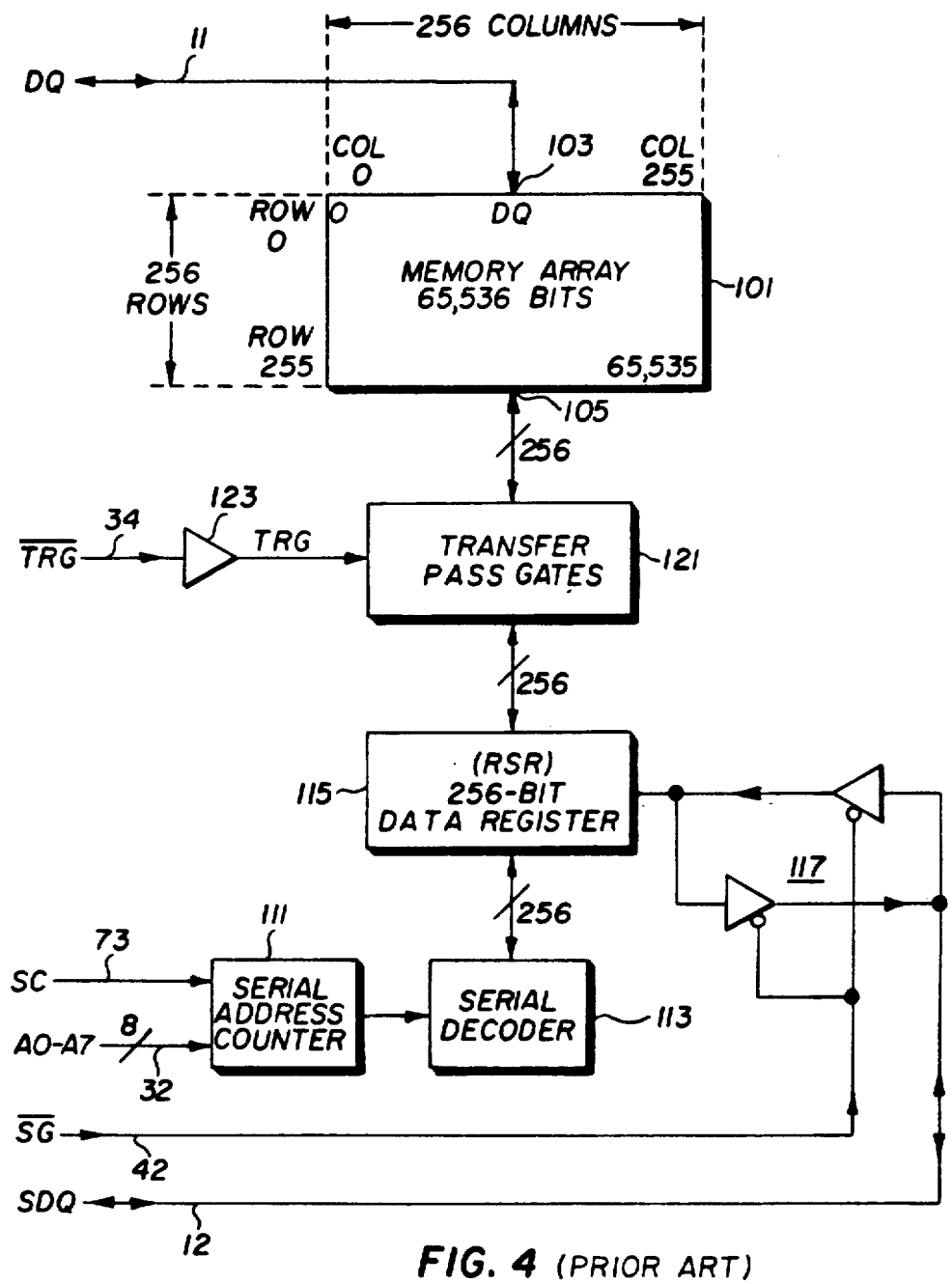
FIG. 4 shows an individual memory unit and its attendant interface circuitry.

As shown in FIGS. 3 and 4, each memory unit comprises a (64k×1) memory 101 formed of an array of (256) rows and (256) columns of storage elements. Medium speed access to memory array 101 is provided through a first bidirectional data port 103 for accessing any individual storage location with the memory array. High speed access is conducted through a second bidirectional port 105 for accessing any row of storage locations within the array. The array is addressed via a serial address counter 111, which is coupled to receive an (eight bit) address (A0-A7) from arbiter 30 over link 32 and a serial counter signal SC from high speed port control unit 80 over link 73. (Associated write enable, column and row assert signals and power supply inputs for a package of four memory units are shown in FIG. 4.) Address counter 111 is coupled to a serial decoder 113 which, in turn, is coupled to an internal shift register 115.

As mentioned previously, high speed shift register 51 of the high speed port has a parallel port 61 coupled via a link 63 to port 12 of array 10. Each bit line SDQ of link 63 couples a respective stage of shift register 51 to internal shift register 115 through a bidirectional serial driver unit 117. Driver unit 117 is controlled by a signal SG-NOT on link 42 from arbiter 30. The respective stages of internal shift register 115 are coupled in parallel to port 105 of array 101 through a set of (256) transfer gates 121, that are enabled by a transfer gate signal TRG that is coupled from control link 34 by driver 123.

The dual port, dual speed memory interface of the present invention is capable of controllably inputting and downloading digital imagery data through each of medium data rate port 11 and high data rate port 12 of video dynamic random access memory array 10 at the same time. In order to realize this simultaneous, multi-speed storage and retrieval capability, access to medium speed port 11 is effected through mux/demux unit 20, which is coupled to receive a serial data stream of digital imagery signals at the medium data rate (e.g. 40 MHz) on input link 25 and controllably writes successive ones of prescribed pluralities (e.g. sixteen digital data signals (bits) representative of a sequence of sixteen pixels), in parallel, into respective ones of the memory arrays 101. Mux/demux unit 20 also controllably reads out image data from each of memory arrays 101 in parallel and assembles the accessed data in the form of a serial output digital data stream for transmission over serial output link 37 to a requesting destination device signals at the medium data rate.

Figure 5:
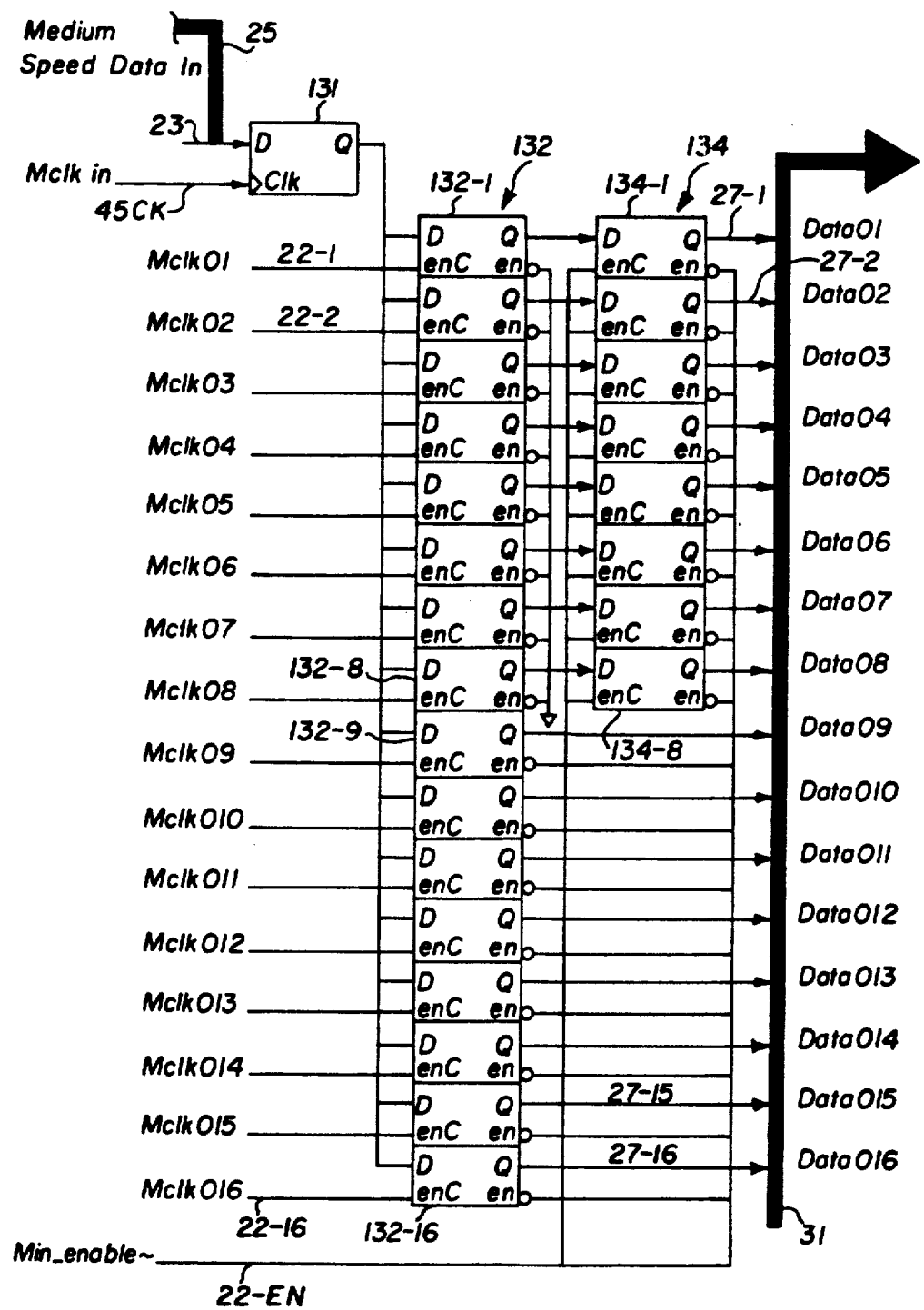
FIG. 5 illustrates an input multiplexer of the mux/demux unit of FIG. 1.

Input multiplexer 21 of mux/demux unit 20 includes a temporary input buffer shown in FIG. 5 as comprising an input flip-flop 131, the D input 23 of which is coupled to serial data link 25, and the clock input of which is coupled to line 45-ck receive a recovered medium speed clock Mclk-in, corresponding to the medium data rate of the data on link 25. The Q output of flip-flop 131 is coupled to the D input of each stage 132-1 . . . 132-16 of a sixteen stage buffer register 132. A set of clock lines 22-1 . . . 22-16 is coupled to a set of clock inputs of the respective stages of register 132. Clock lines 22-1 . . . 22-16 from arbiter 30 supply successive clock signals for successively loading the respective stages of register 132 with the successive bits of the incoming data stream as it is coupled through flip-flop 131. The Q outputs of the first eight stages 132-1 . . . 132-8 of register 132 are coupled to the D inputs of stages 134-1 . . . 134-8 of an eight bit output register 134. The Q outputs of stages 134-1 . . . 134-8 of register 134 and stages 132-9 . . . 132-16 of register 132 are coupled to data lines Data01 . . . Data16 of sixteen bit wide data bus 31. A medium speed data input enable line 22-EN from arbiter 30 is coupled to the clock inputs of register 134 and to the data output enable inputs en of stages 132-9 . . . 132-16 of register 132 and each of the stages of register 134. The data output enable inputs of the first eight stages of register 132 are hardwired low. The manner in which multiplexer 21 operates to controllably load serial input data into memory array 10 may be understood with reference to the timing diagrams depicted in FIGS. 6-10.

Figure 6:
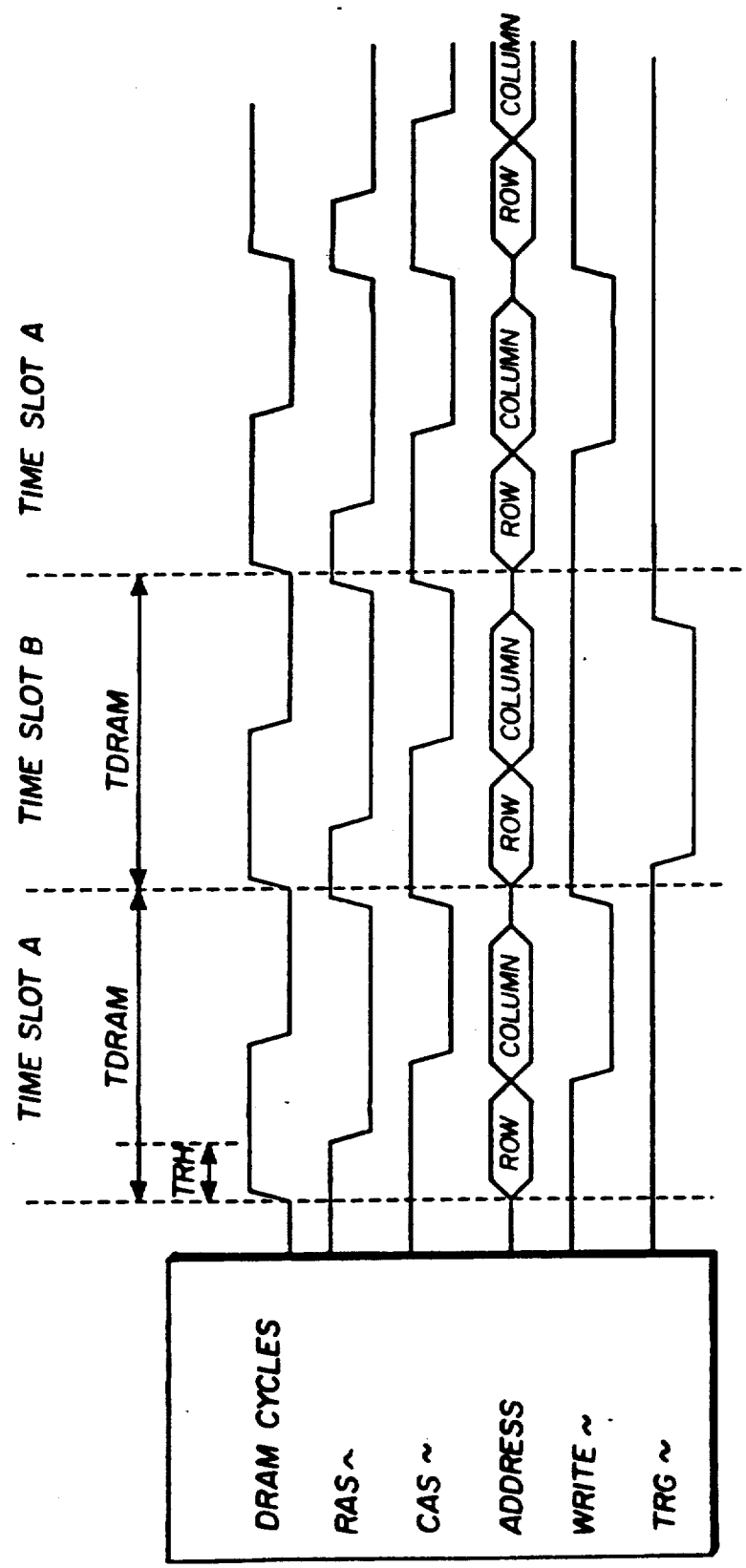
FIG. 6 is a timing diagram of successive memory cycles of one of the memory units of FIG. 4.

More particularly, FIG. 6 is a timing diagram of successive memory cycles of one of the memory units of FIG. 3. As shown in FIG. 6, successive memory cycles are demarcated as alternating, interleaved time slots 'A' and 'B'. As will be described in detail below, the 'A' time slots are assigned principally for effecting medium speed write and read operations through the medium speed port of memory array 10. The 'B' time slots are assigned for accessing the high speed port of the memory array and for internal housekeeping, such as CPU read and write operations, and refresh.

Figure 7:
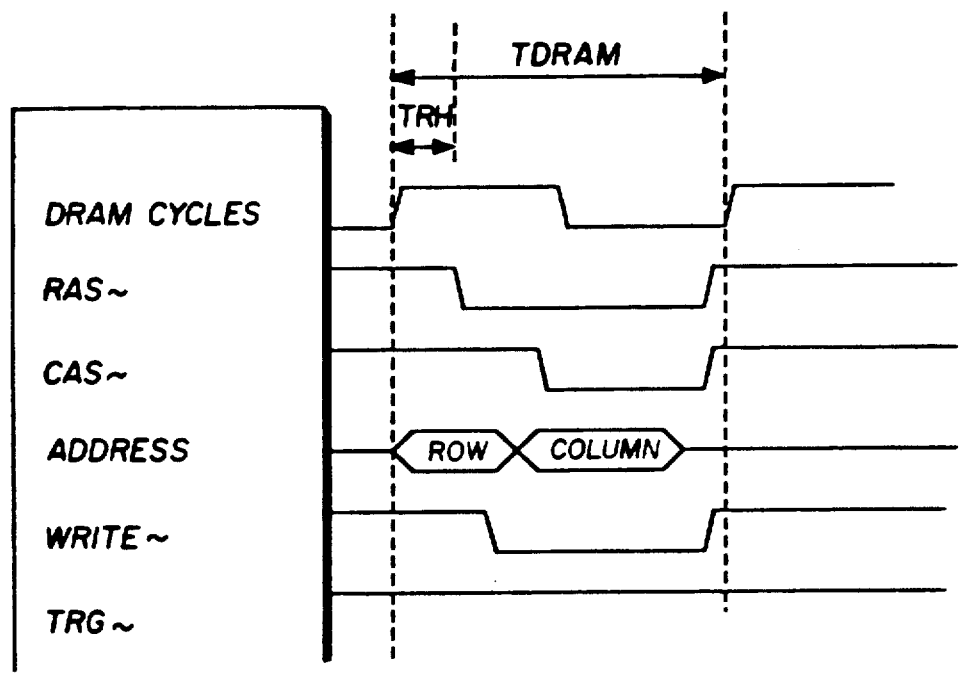
FIG. 7 is the timing diagram of a memory cycle of a memory array during an 'A' time slot for a write mode of operation to the medium speed port of the image memory of FIG. 4 and the timing diagram of a memory write cycle during a 'B' time slot for a CPU write operation.
Figure 8:
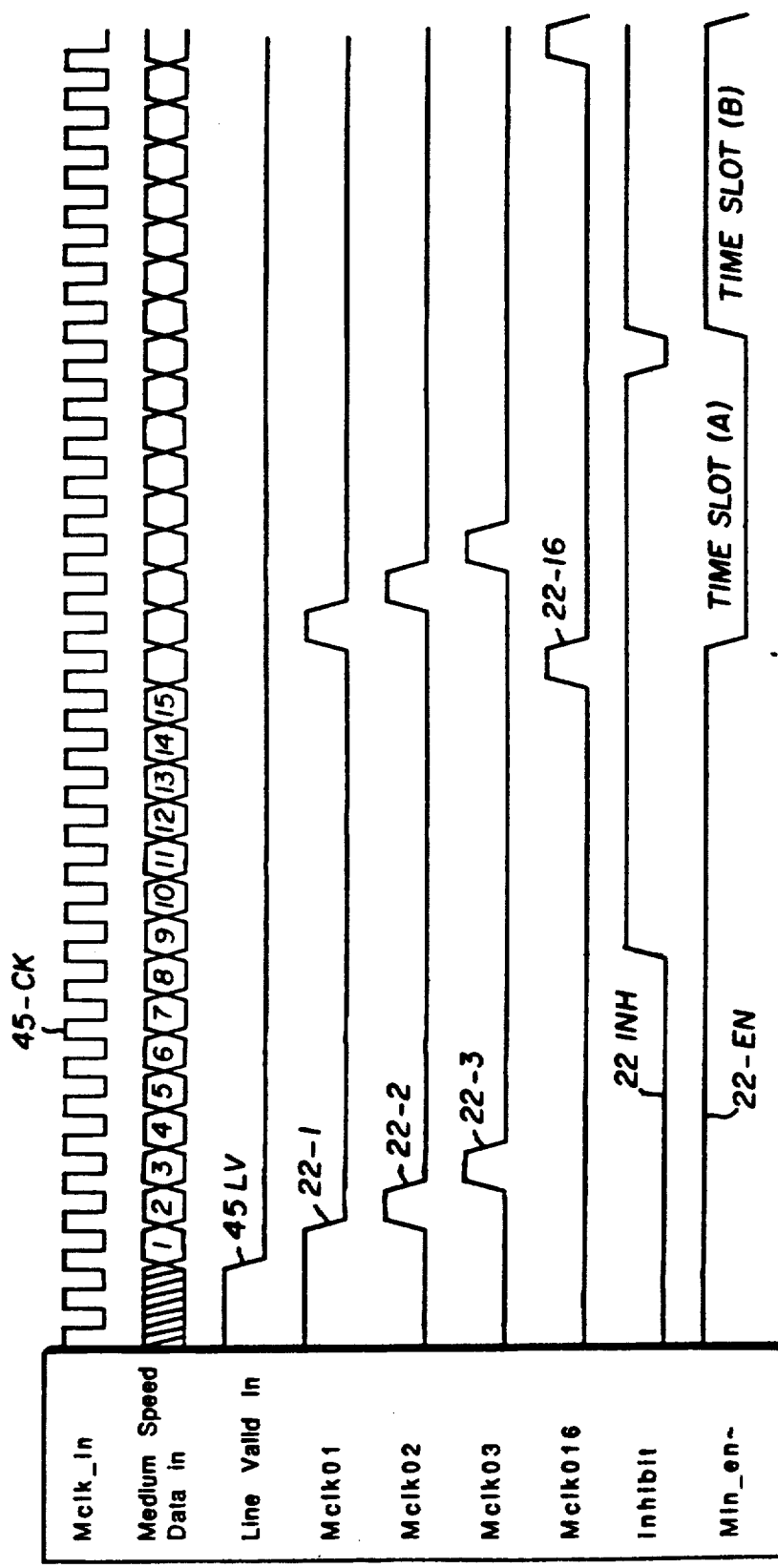
FIGS. 8-10 contain a timing diagram showing the manner in which a single line of data is multiplexed through the input multiplexer and coupled to the medium speed port of the image memory array of FIG. 4.
Figure 9:
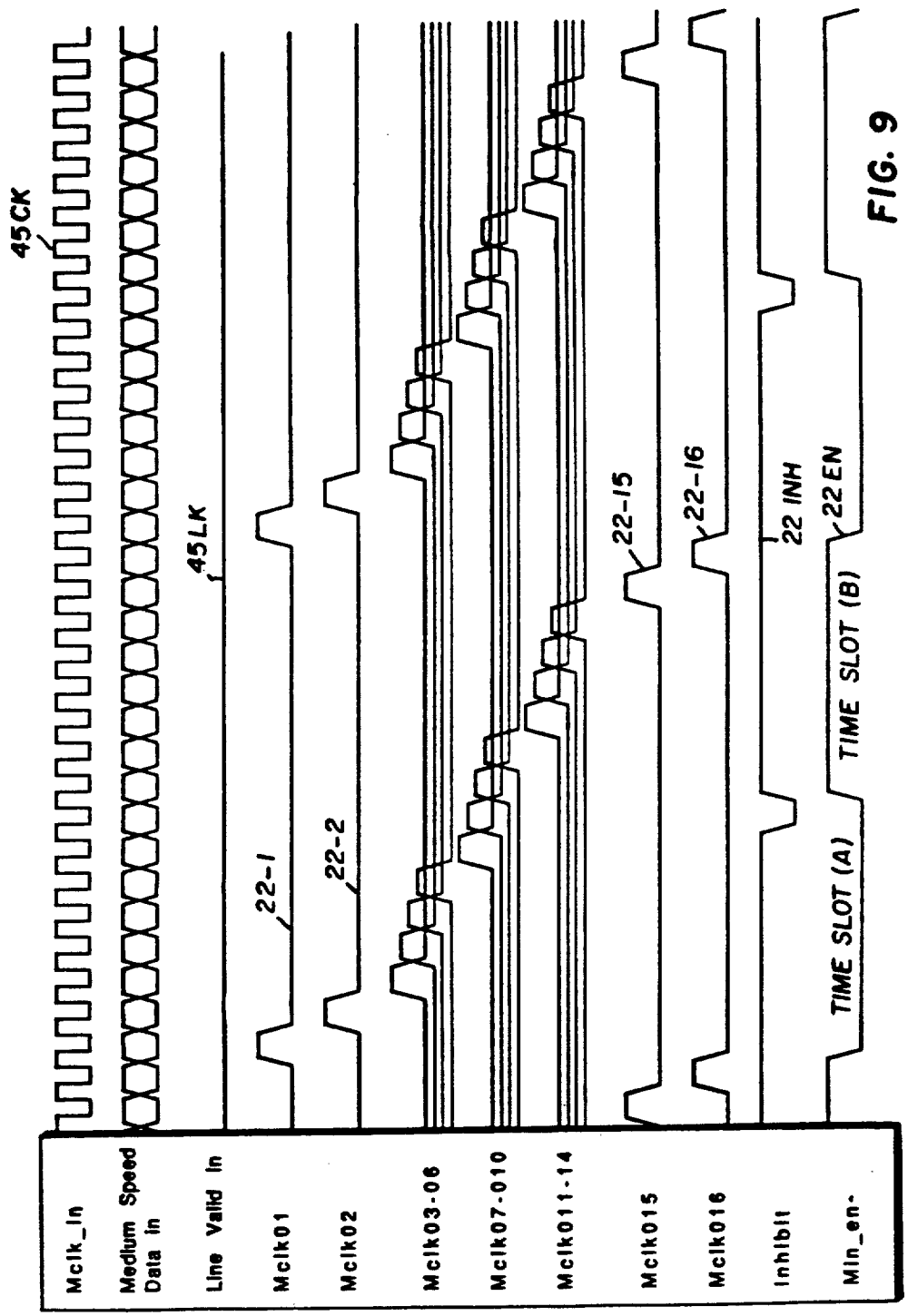
Figure 10:
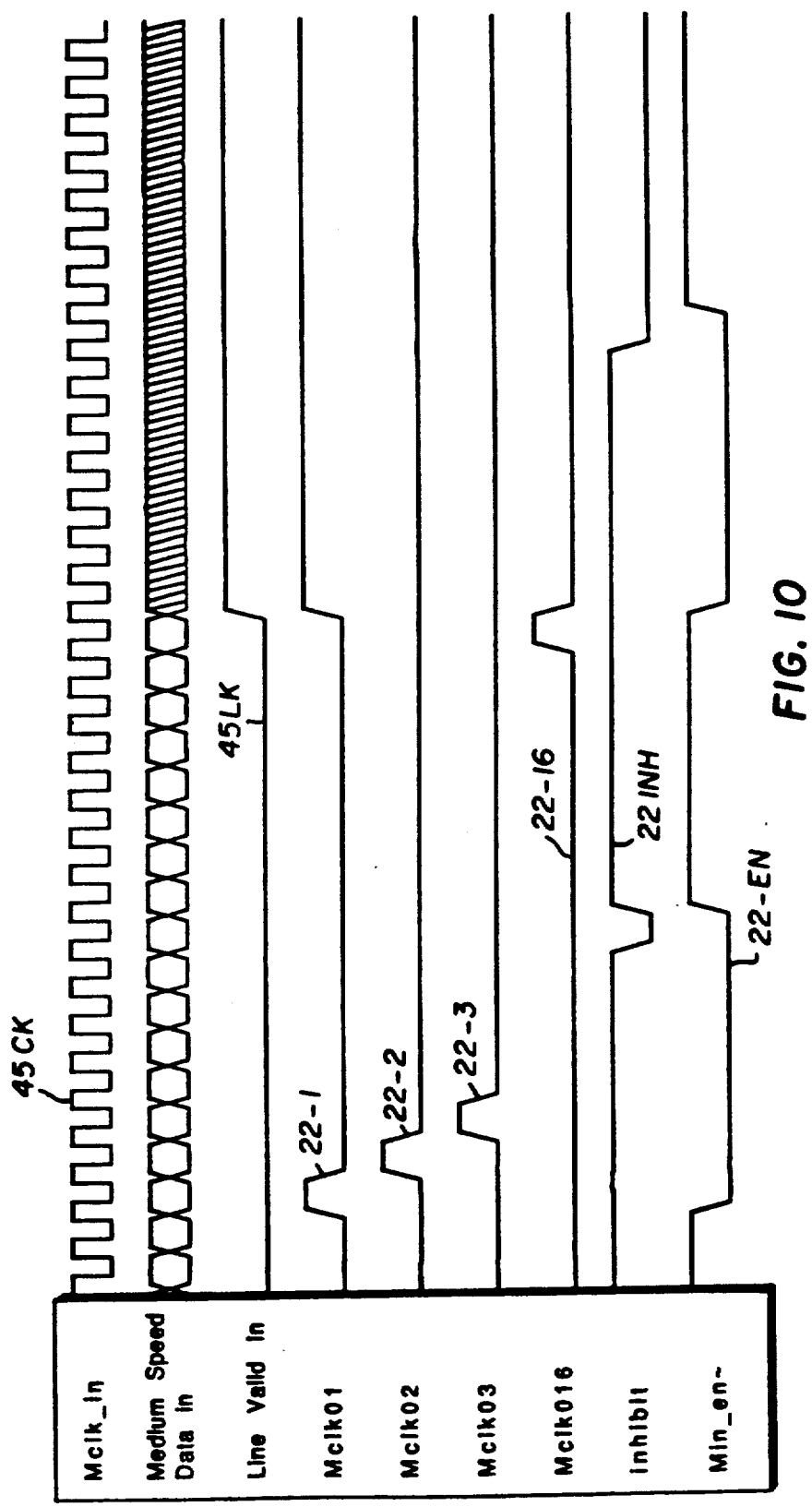

FIG. 7 is a timing diagram of a memory cycle of memory array 10 during an a 'A' time slot for a write mode of operation to medium speed port 11. (The timing diagram of FIG. 7 also represents a time slot 'B' CPU write operation.) FIGS. 8-10 contain a timing diagram showing the manner in which a single line of data is multiplexed through input multiplexer 21 and coupled to the medium speed port 11 of memory array 10. In each of the timing diagrams, unless otherwise indicated, the respective signal traces are identified by the reference characters associated with the links over which the signals are coupled.

MEDIUM SPEED WRITE

The transmission of data from an upstream source of imagery data is asynchronous with respect to the operation of the image memory and can begin at any time. Consequently, input multiplexer 21 initially buffers all input data, which is then written into memory during an 'A' time slot memory cycle scheduled by arbiter 30, so that no data will be missed. When a data source, such as video camera, begins sending data, it alerts the arbiter by asserting a line valid signal on line 45LV. The data stream 25 is clocked through flip-flop 131 by the medium speed clock 45ck and applied in parallel to the D input of each stage of register 132. One medium speed clock cycle after receiving the line valid in signal on line 45LV, arbiter 30 begins generating the sequence of data latching signals Mclk01 . . . Mclk016, thereby successively clocking the first sixteen bits of the first line of data from the camera into stages 132-1 . . . 132-16 of register 132. Upon the application of Mclk signal Mclk016 on link 22-16 to register stage 132-16, arbiter 30 causes medium speed inhibit enable (Min_en) line 22-EN to go low, indicating the start of an 'A' time slot.

As noted above, the 'A' time slots are reserved for accessing the medium speed port of memory array 10, while the 'B' time slots are used for other memory operations including internal shift register/memory transfers, refresh and CPU access. When arbiter 30 initiates an 'A' time slot, it necessarily implies that a 'B' time slot is currently inhibited (but will follow immediately upon conclusion of the current 'A' time slot as shown in FIG. 6). Consequently, the alternating state of the Min_en signal indicates the alternating times of occurrence of the 'A' and 'B' time slots, where an 'A' time slot occurs during the low state of line 22 EN and a 'B' time slot occurs when line 22 EN is asserted high.

The change in state of line 22-EN causes the contents of the first eight stages 132-1 . . . 132-8 of register 132 to be loaded into parallel stages of register 134. This transfer of the first eight bits of data preserves the data in the buffer, so that all sixteen bits can be stored in memory. Namely, the current sixteen (first sixteen in the line) bits of data (bits one though eight in register 134 and bits nine through sixteen in stages 132-9 . . . 132-16 of register 132) will remain valid during the entirety of the upcoming 'A' time slot during which medium speed data can be written into memory, time slot 'A' terminating with the eighth bit of the next (second) group of sixteen bits in the line. Line 22 EN is coupled to the output enable inputs of the second eight stages 132-9 . . . 132-16 of register 132 and stages 134-1 . . . 134-8 of register 134, so that data associated with the first sixteen pixels of the line is asserted onto data bus 31 and coupled to input port 11 of memory array 10 for storage in the location in each memory unit designated by the address on link 32 from arbiter 30 during time slot 'A'.

Also shown in FIGS. 8-10 is an inhibit signal 22 INH which is internal to arbiter 30 and is used to ensure that no 'B' time slot will be scheduled to begin at a time that would otherwise prevent a subsequent 'A' time slot from occurring on time. Namely, each of the alternating and interleaved 'A' and 'B' time slots is eight medium speed clock cycles long. If a 'B' time slot were to begin after receipt of the ninth data bit, then the next immediate 'A' time slot would not begin until after the beginning of the next group of sixteen data bits, thereby causing data to be lost. Thus, the time at which inhibit line 22-H goes high is the latest time that a 'B' time slot may begin. Should the arbiter need to schedule a 'B' time slot, it is permitted to do so only when the inhibit line is low, but it may not initiate a 'B' time slot when the inhibit line is high, thereby guaranteeing that the next required 'A' time slot will start on time.

As successive segments or groups of sixteen data bits are applied to flip-flop 131 and latched, they are parallel-loaded into respective addresses in the sixteen memory units of array 10 as specified by arbiter 30. At the end of the line of pixel data, the line valid inhibit signal 45LV changes state, in response to which arbiter 30 terminates the application of medium speed load clocks Mclk on lines 22-1 . . . 22-16, to prevent the loading of invalid data through input multiplexer 21. Min_en line 22-EN goes low to drive bus 31 with whatever data has been latched in the registers for storage during time slot 'A'.

MEDIUM SPEED READ

Access to medium speed port 11 for reading out data to a requesting device is effected through output demultiplexer 40, shown in detail in FIG. 11, to be described below. The manner in which demultiplexer 40 operates to controllably read out data from memory array 10 for transmission as a medium speed serial data stream to a requesting device will be described with reference to the timing diagrams depicted in FIGS. 12-15.

Figure 11:
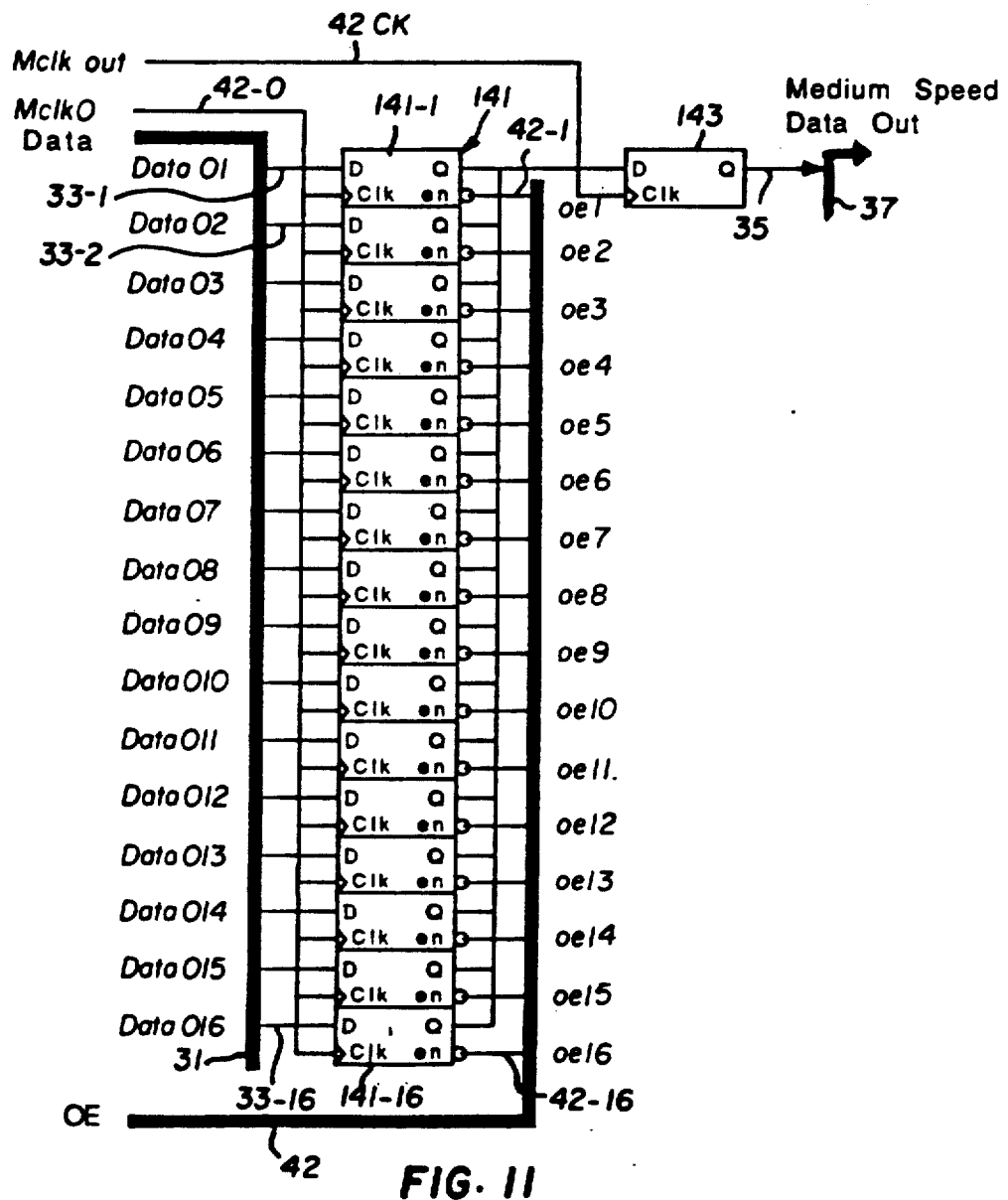
FIG. 11 shows the make-up of an output demultiplexer for reading out data from the medium speed port of the image memory of FIG. 4.

Output demultiplexer multiplexer 40 includes a sixteen stage output register, shown in FIG. 11 as comprising stages 141-1 . . . 141-16, the D inputs of which are coupled to the respective data portions Data01 . . . Data016 of data bus 31 and clock inputs of which are coupled in common to line 42-0 for receiving an output buffer clock signal Mclk0 from arbiter 30. Clock Mclk0 is used to load the contents of data bus 31 into the respective stages of output register 141. The Q output of each stage of register 141 is coupled in common to the D input of an output flip-flop 143, which is clocked by a medium speed output clock signal Mclk out on line 42CK. The Q output of output flip-flop 143 is coupled to output data link 37. Output enable inputs en of the respective stages 141-1 . . . 141-16 of register 141 are coupled to an output enable bus 420E from arbiter 30. The manner in which demultiplexer 40 operates to controllably output parallel input data on bus 31 from memory array 10 to serial output link 37 may be understood with reference to the timing diagram depicted in FIGS. 12-15.

Figure 12:
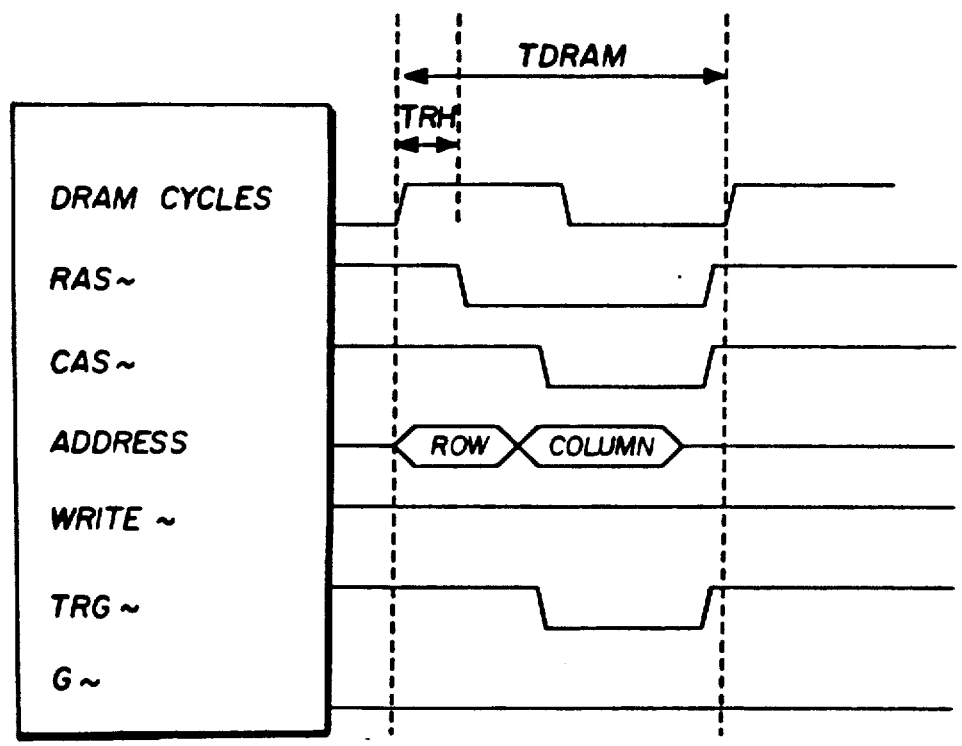
FIG. 12 is the timing diagram of a memory cycle of the memory array of FIG. 4 during an 'A' time slot for a read mode of operation from the memory's medium speed port and the timing diagram of a memory read cycle during a 'B' time slot for a CPU read operation.
Figure 13:
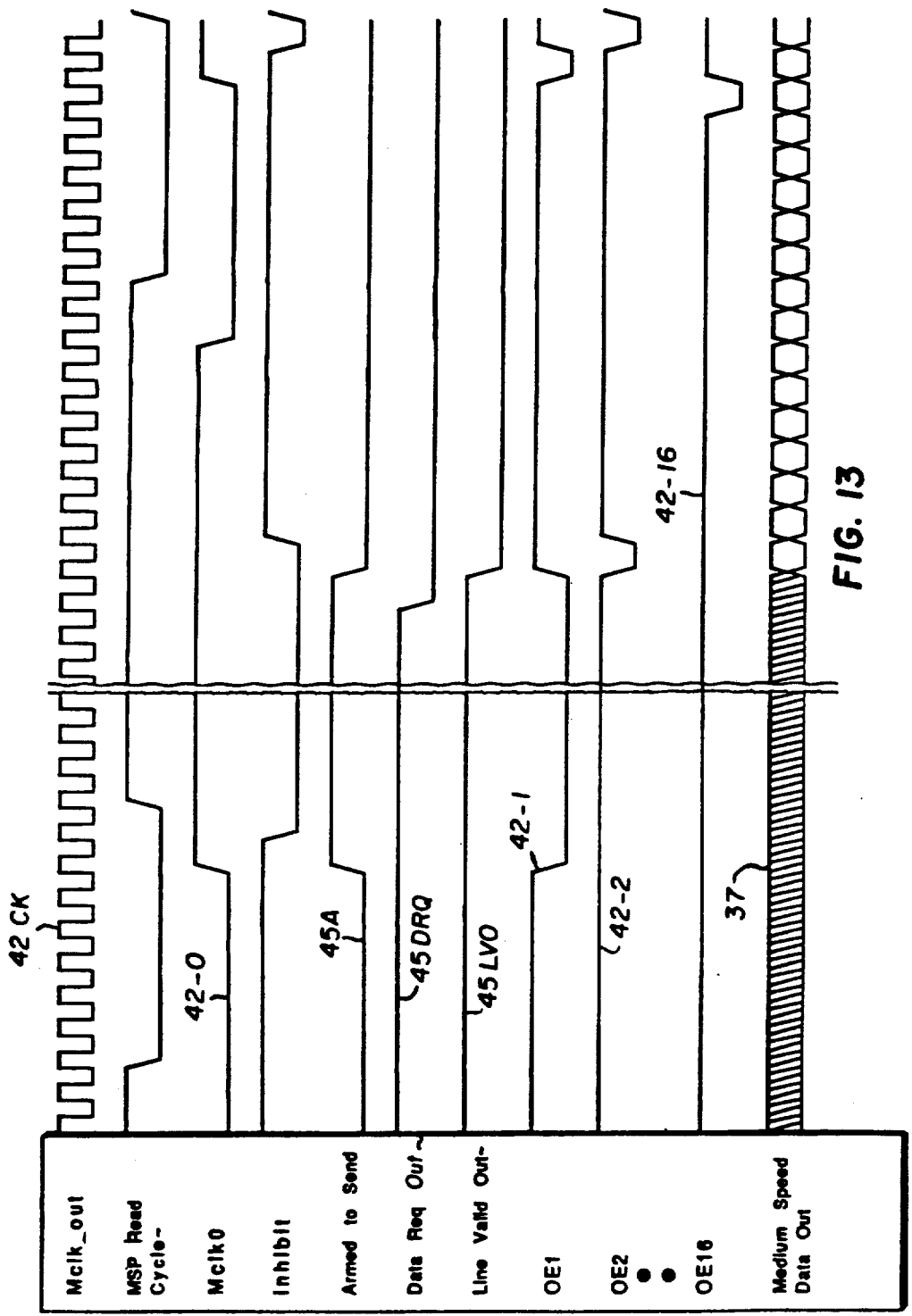
FIGS. 13-15 contain a timing diagram showing the manner in which a single line of data is accessed from the memory array of FIG. 4 and output through an output demultiplexer.
Figure 14:
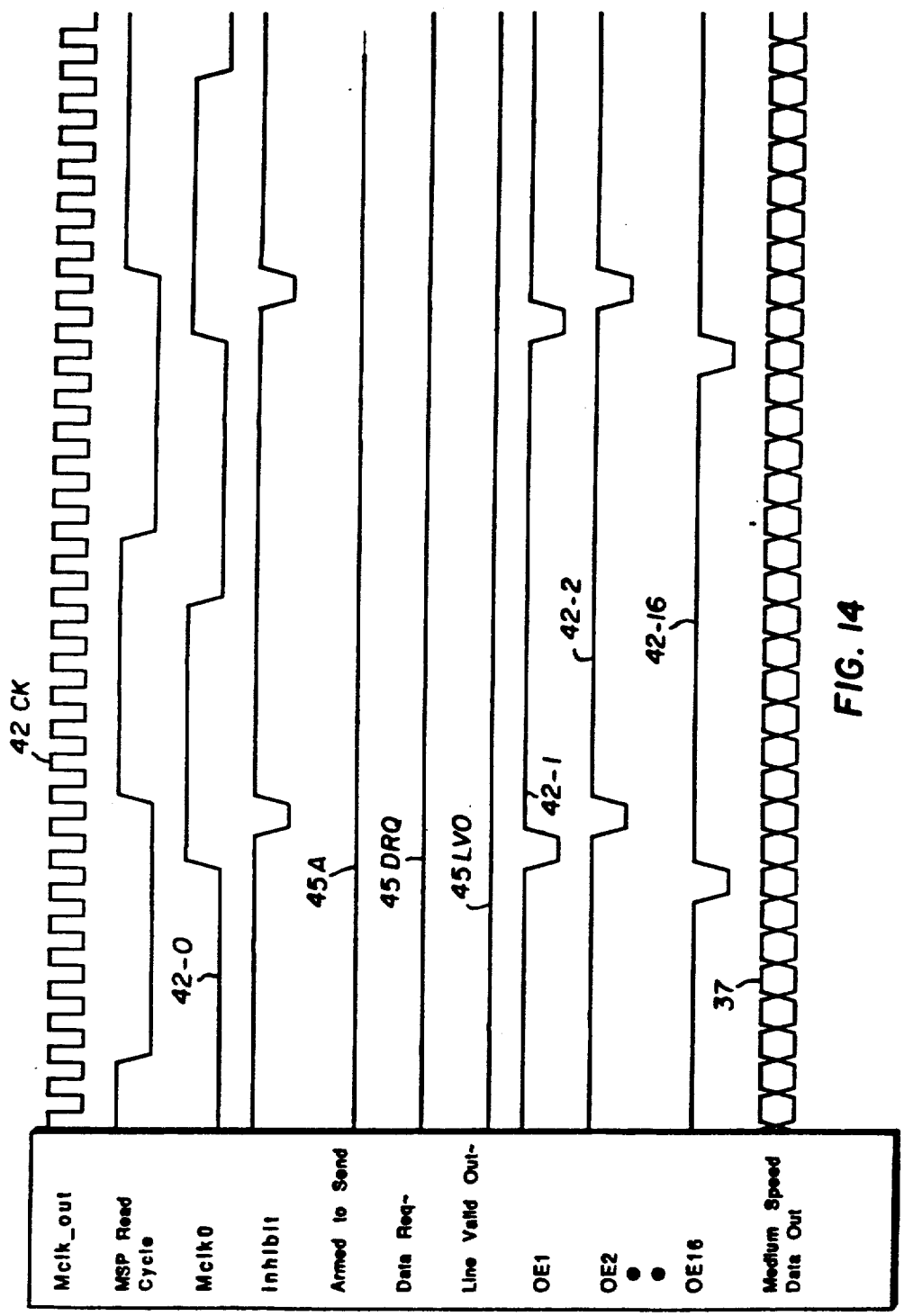
Figure 15:
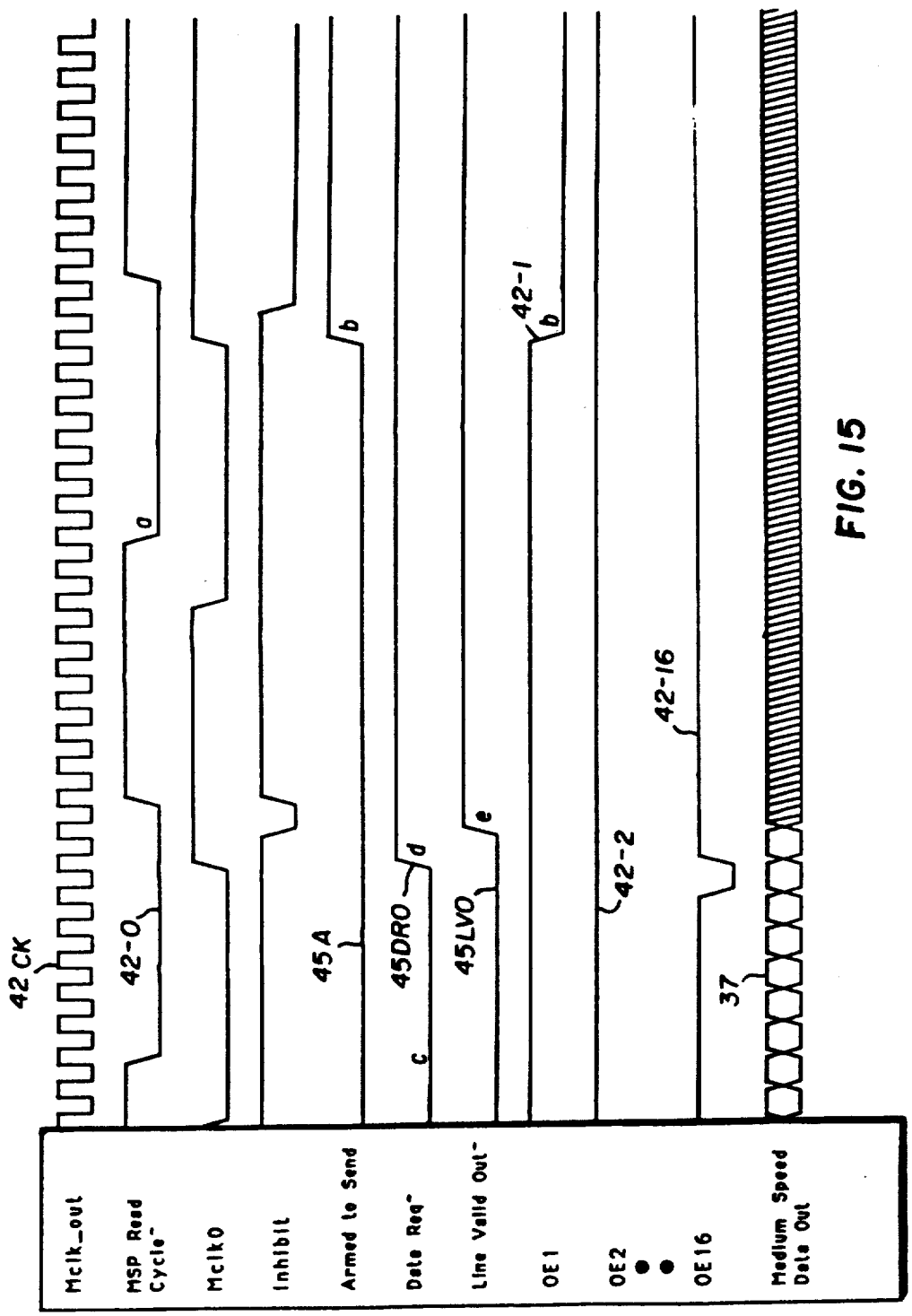

More particularly, FIG. 12 is a timing diagram of a memory cycle of memory array 10 during an 'A' time slot for a read mode of operation from medium speed port 11. (The timing diagram of FIG. 12 also represents a time slot 'B' CPU read operation.) FIGS. 13-15 contain a timing diagram showing the manner in which a single line of data is accessed from memory array 10 and output through demultiplexer 40 to a downstream destination device. Namely, during time slot 'A', arbiter 30 reads out image data from each of the (sixteen) memory units of array 10 in parallel into demultiplexer 40. Each group of sixteen bits is then output in the form of a serial output digital data stream for transmission over serial output link 37 to a requesting destination device signals at the medium data rate.

In preparation for reading out a line or a frame of imagery data within memory array 10 to a requesting destination device, output buffer 141 is preloaded with the beginning (the first sixteen bits) of a line of data within the image memory array 10. For this purpose, as shown in FIG. 13, during time slot 'A', an output buffer load clock signal Mclk0 is asserted high, so as to effect a parallel loading into stages 141-1 . . . 141-16 of the data read out from each of the sixteen memory units of array 10. At the same time, arbiter 30 changes the state of an Armed to Send link 45A, from low to high to indicate that the medium speed port is ready to begin sending data whenever a request for data is received. The arbiter also asserts output enable line OE1 low, so that the first pixel bit in stage 141-1 of register 141 is available at the D input of output flip-flop 143. (Although this bit value is thereby repetitively clock out of the Q output of flip-flop 143 by medium speed clock pulses Mclk out on line 42 CK, the data is 'don't care' data, as it is being ignored.) In addition, one medium speed clock later, the internal inhibit line of the arbiter goes low, indicating that a time slot 'B' may be scheduled, if needed.

The outputting of data to a destination device from the medium speed port is triggered by the destination device transmitting a request for data, Data Req Out, over link 45 DRQ to arbiter 30. In FIG. 13, this action is identified by the data request line 45 DRQ going low. In response to the medium speed port data request, at the next medium speed clock, the first bit of data is clocked out of flip-flop 143. In addition, arbiter 30 causes the state of a line valid out line 45LVO, informing the requesting device that medium speed data transmission is to begin. Also, armed-to-send line 45A goes low, indicating that the medium speed port is no longer preloaded for a new line of data. The second output enable signal OE02 is asserted on link 45OE, so as to couple the second bit of data within stage 141-2 of register 141 to the D input of output flip-flop 143. This data second bit is then clock out on serial link 37 at the next medium speed clock signal Mclk_out. For each subsequent output enable signal OE03 . . . OE16, a successive data bit is clocked out to complete the serial read out of the first group of sixteen preloaded data bits.

As in the case of a medium speed write operation, described above, arbiter 30 generates and uses internal inhibit signal 22 INH to define when 'B' time slots must be inhibited. 'B' time slots are not permitted until the inhibit signal is asserted low, so that an 'A' time slot will occur as required for reading out the next sixteen bits of data from memory and preloading output register 141. To guarantee that the next 'A' time slot will occur on time, it is necessary to inhibit the start of a 'B' time slot with the start of the clocking out of the second data bit of the group of sixteen.

Then, during the next 'A' time slot, coincident with the clocking out of the last or sixteenth bit of the current (initial, at the beginning of a line) group of sixteen pixel data bits, output buffer load clock signal MclkO is again asserted high, so as to effect a parallel loading into stages 141-1 . . . 141-16 of the next group of sixteen data bits read out from memory array 10. The output enable OE1 for the first bit is also asserted, so that the first data bit of the second group of sixteen will be clocked out of flip-flop 143 immediately following the sixteenth data bit of the current group. One medium speed clock cycle later, the inhibit line 22 INH goes low, indicating that a 'B' time slot may be initiated. Also, at this time, the next output enable OE2 is asserted for the second data bit in the next group of sixteen. As each subsequent output enable signal OE03 . . . OE16 is supplied to register 141, a successive data bit of the next group is clocked out to complete the serial read out of that group of sixteen data bits. This sequence of events continues uninterrupted until the end of the line of data.

At the end of the line of data (FIG. 15), the requesting destination device causes the data request line 45DRQ to go high, in response to which arbiter 30 causes the state of line valid out 45LVO to go high. The medium speed port then finishes sending out any remaining data bits within the line (either a complete or partial group of sixteen). After the remaining bits have been clocked out, arbiter 30 asserts MclkO high to preload the first sixteen bits of the next line of data (which may be the next line of the current frame or the first line of the next frame of data in the event that the current line is the last line of a frame). Coincidentally with the preloading of the next line, armed-to-send line 45A is asserted high and output enable OE1 goes low, so that the state of the medium speed output port after the completion of a line (FIG. 15) is the same as at the beginning of a line (FIG. 13).

HIGH SPEED ACCESS

As described above, in addition to controllably inputting and downloading digital imagery data through medium data rate port 11, the dual port memory interface of the present invention is capable of accessing high data rate port 12 of video dynamic random access memory array 10. As shown in FIG. 1, access to high speed port 12 is effected through high speed interface unit 50, which is coupled to receive a serial data stream of high data rate (e.g. 220 MHz) digital imagery signals on input serial link 55 and controllably writes successive ones of prescribed pluralities (e.g. sixteen digital data bits, representative of a sequence of sixteen pixels), in parallel, into the input stage of each of the (sixteen) respective internal shift registers of the memory array 10. High speed interface unit 50 also controllably reads out the contents of these internal shift registers in groups of sixteen parallel bits and assembles the accessed data in the form of a serial output digital data stream for transmission over serial output link 56 to a requesting destination device.

Figure 16:
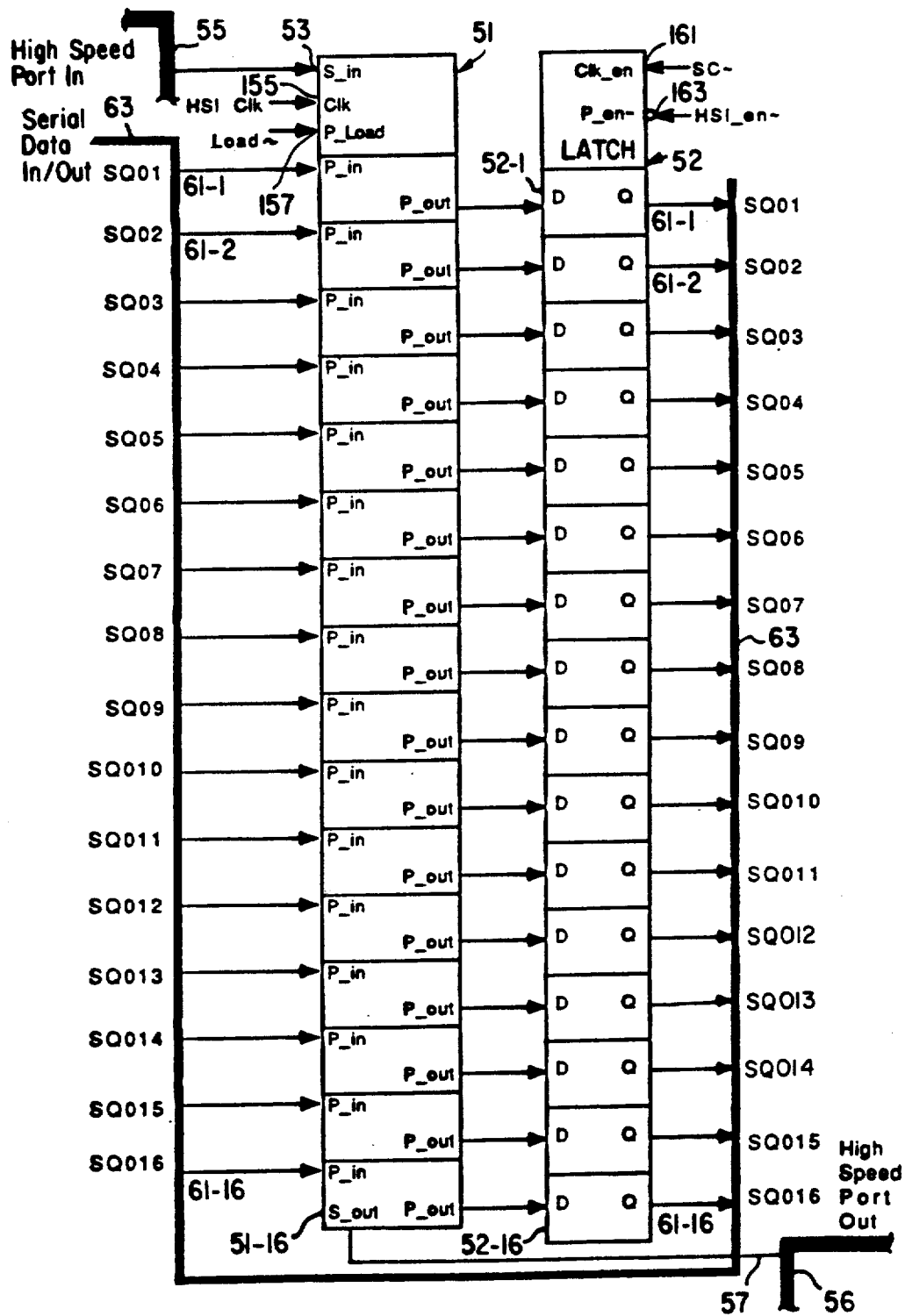
FIG. 16 diagrammatically illustrates a high speed interface unit for accessing the high speed port of the dual port memory of FIG. 4.

For this purpose, as shown in FIG. 16, high speed interface unit 50 includes a sixteen bit 'final' shift register 51, respective stages 51-1 . . . 51-16 of which are coupled in parallel to respective stages 52-1 . . . 52-16 of an associated temporary output register 52. The respective bit portions SQ01 . . . SQO16 of serial data in/out bus 63 are coupled to the parallel inputs P_in of stages 51-1 . . . 51-16 of register 51 and to the Q outputs of the respective stages 52-1 . . . 52-16 of register 52. Serial input link 55 is coupled to the first stage 51-1 of register 51 through its serial input 53, while high speed serial output line 56 is coupled to the output port 57 of the last (sixteenth stage) of register 51. A high speed input clock HSI Clk line 150 used by the accessing device is coupled through high speed port control unit 80 to the clock input 155 of register 151. Similarly, a load signal LOAD from control unit 80 is coupled to parallel-load input P_load 157. A high speed serial output clock signal SC from control unit 80 is coupled to the clock enable Clk_en input 161 of register 52 and a high speed enable signal HSI_en signal from arbiter 30 is coupled to its parallel-load enable P_en input 163. The manner in which interface unit 50 controllably loads serial data into memory array 10 may be understood with reference to the timing diagrams depicted in FIGS. 17-22.

Figure 17:
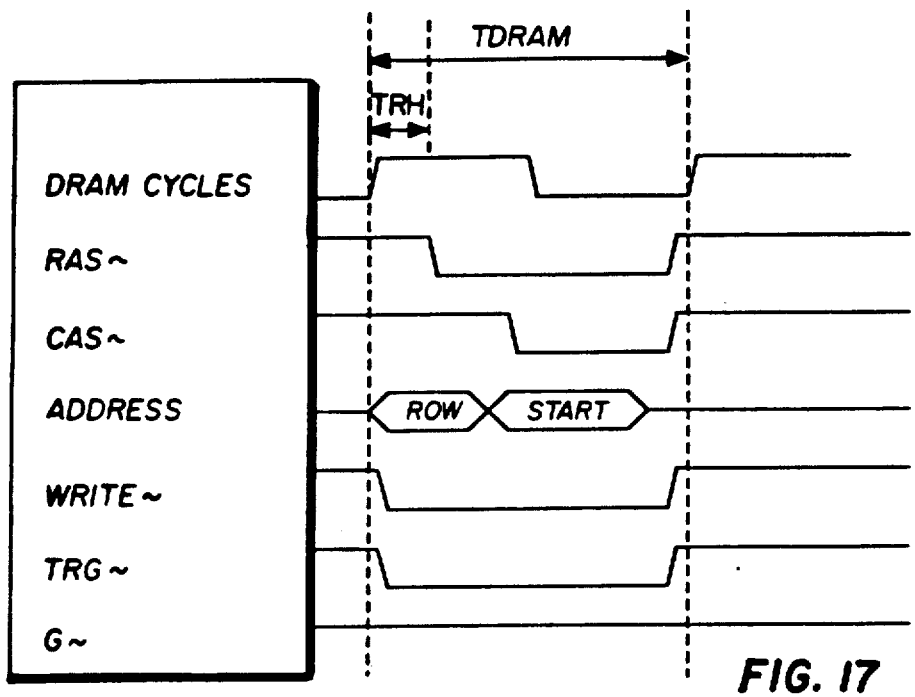
FIG. 17 is a timing diagram of a 'B' time slot write mode control cycle for enabling a high speed input of the memory array of FIG. 4.
Figure 18:
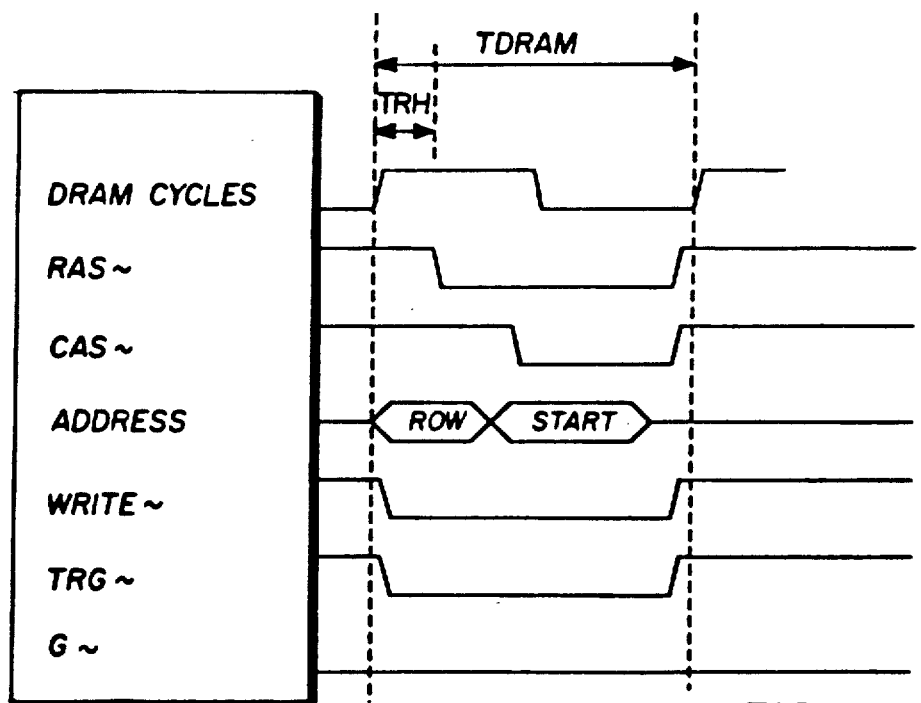
FIG. 18 is a timing diagram of a 'B' time slot internal shift register to memory cycle.
Figure 19:
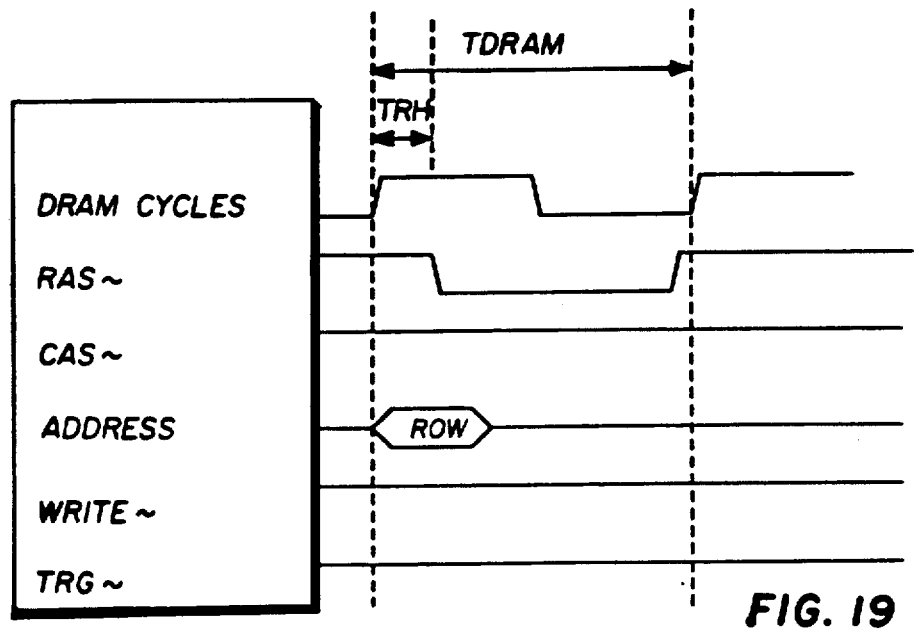
FIG. 19 is a memory cycle timing diagram of a row address strobe only refresh cycle.
Figure 20:
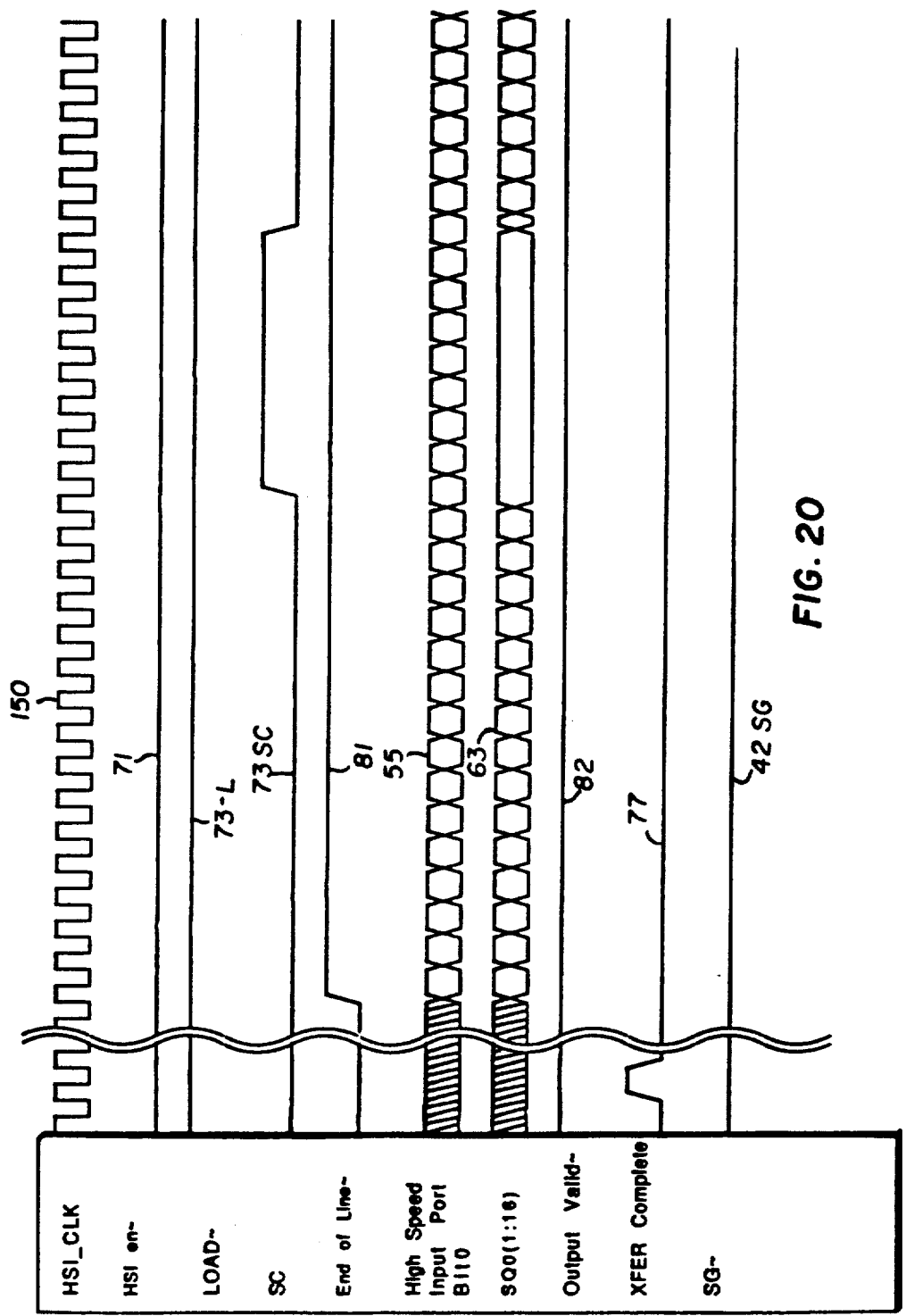
FIGS. 20-22 contain a timing diagram showing the manner in which a single line of data is written into memory via the high speed interface unit of FIG. 16 and coupled to the internal shift register of the memory of FIG. 4.
Figure 21:
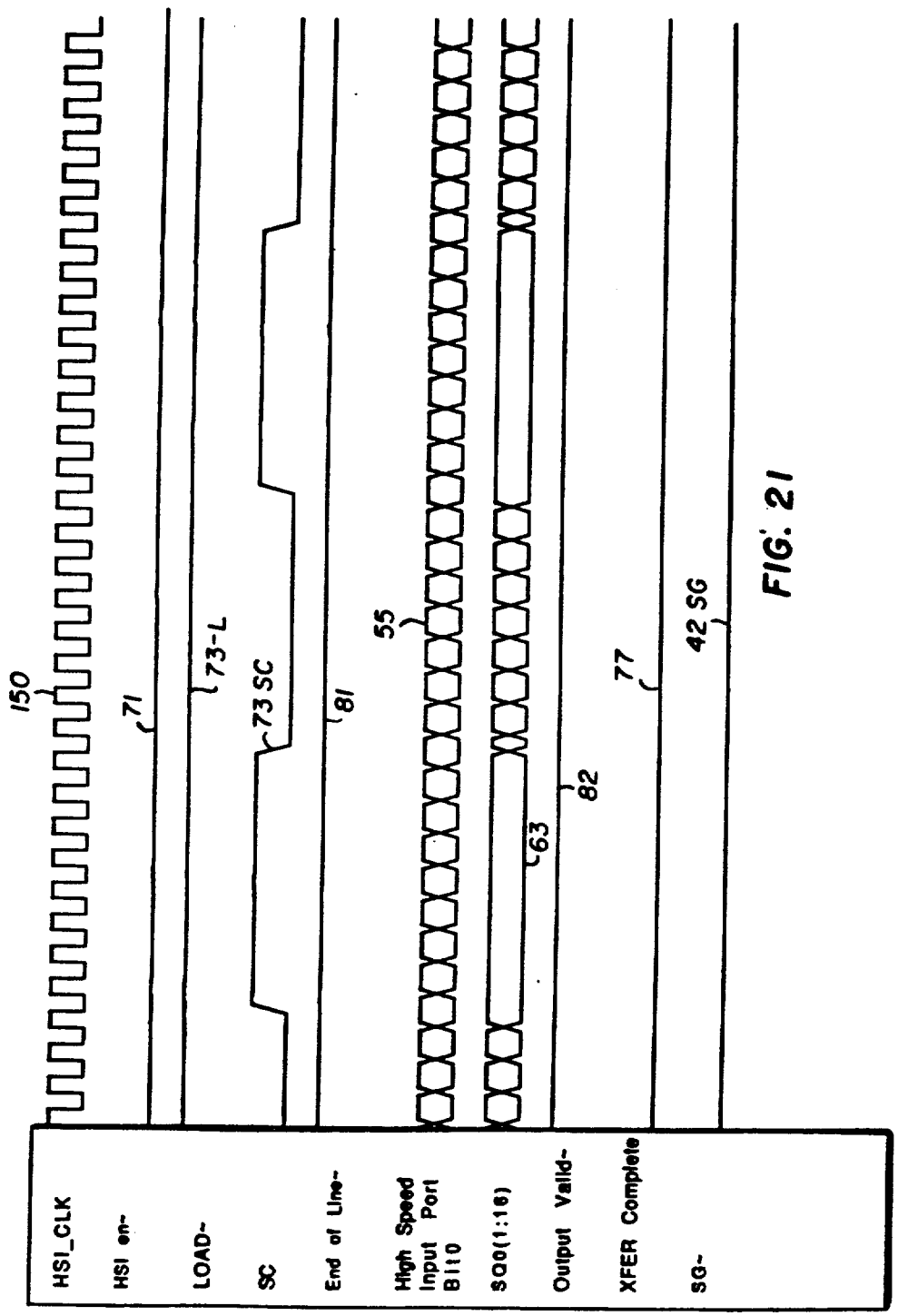
Figure 22:
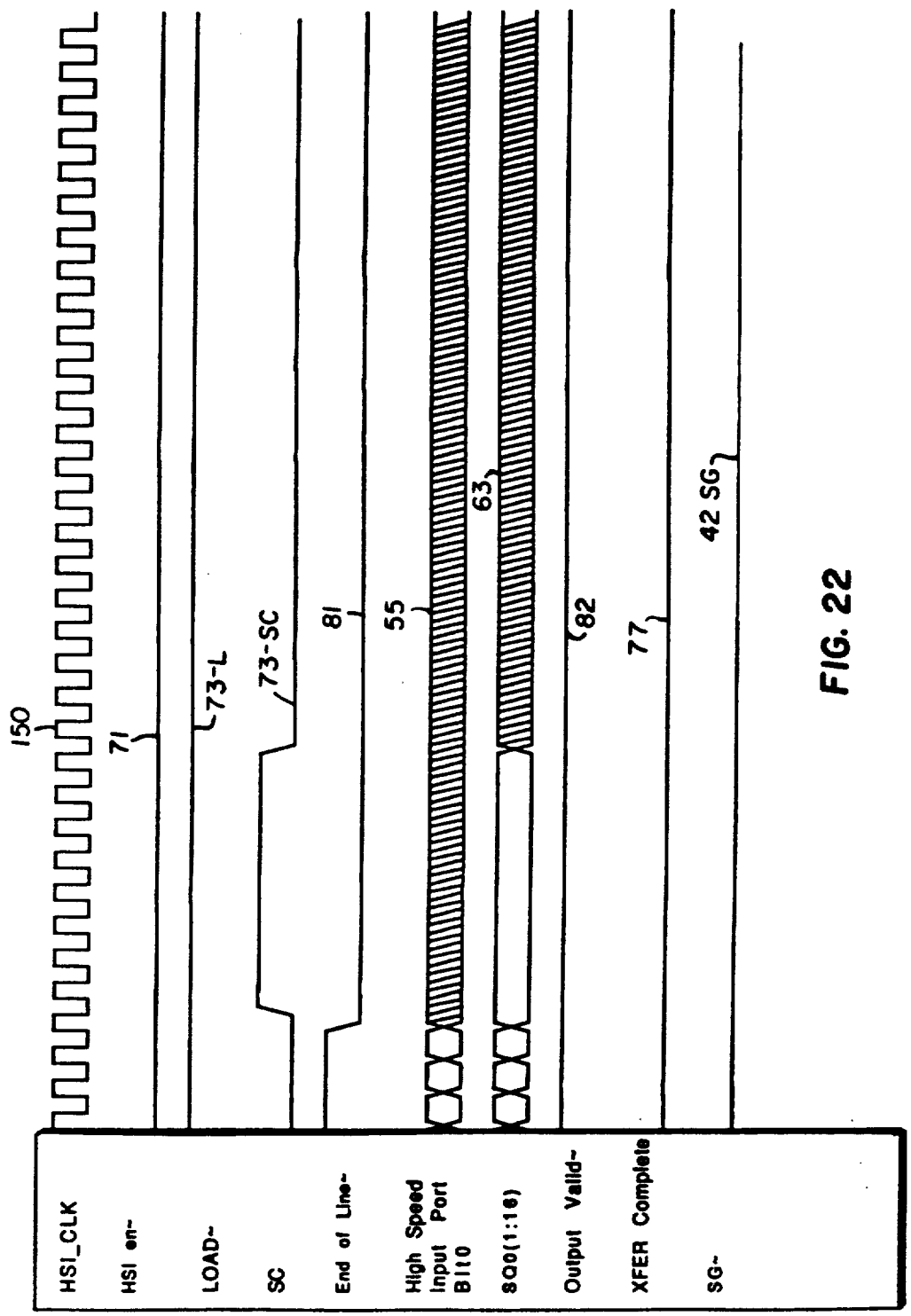

More particularly, FIG. 17 is a timing diagram of a 'B' time slot write mode control cycle (for enabling a high speed input) of memory array 10, and FIG. 18 is a timing diagram of a 'B' time slot internal shift register to memory cycle. (The timing diagram of FIG. 19 shows a row address strobe only refresh cycle, an explanation of which is not necessary for an appreciation of the present invention. Attention may be directed to documentation supplied by the manufacturer for details of the same.) FIGS. 20-22 contain a timing diagram showing the manner in which a single line of data is written into memory via high speed interface unit and coupled to the internal shift registers of memory array 10. Again, in each of the timing diagrams, unless otherwise indicated, the respective signal traces are identified by the reference characters associated with the links over which the signals are coupled.

HIGH SPEED WRITE

As in the case of the transmission of medium speed data, the inputting of high speed serial data from an upstream source is asynchronous with respect to the operation of the image memory and can begin at any time. Consequently, as shown in FIG. 20, both the high speed enable and load inputs 155 and 157, respectively, to register 51 are enabled, so that any incoming data may be buffered by interface unit 50. (At the beginning of each high speed input data frame, the write mode control cycle shown in FIG. 17 is executed, so that the transfer direction of the internal shift registers 115 of the memory array is from register to memory.) The data is temporarily buffered in groups of sixteen pixels and, after a plurality of lines have been clocked into the internal shift registers of the memory array, the data is transferred or loaded into memory during a 'B' time slot memory cycle scheduled by arbiter 30, so that no data will be missed.

When the data source, e.g. video camera, begins sending data, it asserts an end-of-line signal 81, which is coincident with the beginning of the high speed serial data stream. The incoming data 55 is serially clocked through the successive stages of register 51 by the high speed clock at clock port 155. As the sixteenth data signal is clocked in control unit 80 asserts serial clock signal SC high, thereby parallel-latching the contents of register 51 into buffer 52 and, simultaneously, transfers the latched data to the first stage of the sixteen internal shift registers 115 (FIG. 4) of memory array 10.

As successive groups of sixteen pixel signals are coupled over high speed input link 55 they are buffered and shifted out in the same manner. During each transfer of the data latched in buffer 52, the contents of internal shift registers 115 are shifted a stage (bit) at a time. This sequence of events continues until, as shown in FIG. 22, the data source asserts end-of-line 81 low, indicating that a complete line of data has been transmitted. After the last group of sixteen pixel bits has been shifted into the memory's internal shift registers, arbiter 30 schedules a shift register to memory transfer cycle (FIG. 19). Upon the completion of this internal transfer, arbiter 30 advises control unit 80 that the data has been loaded, by asserting a transfer complete signal XFER complete on line 77, to enable the next high speed input cycle to proceed. A prescribed line-to-line separation interval between source to memory transmissions is provided to allow for each line to be stored after it has been latched and shifted into the memory's internal shift register.

HIGH SPEED READ

Figure 23:
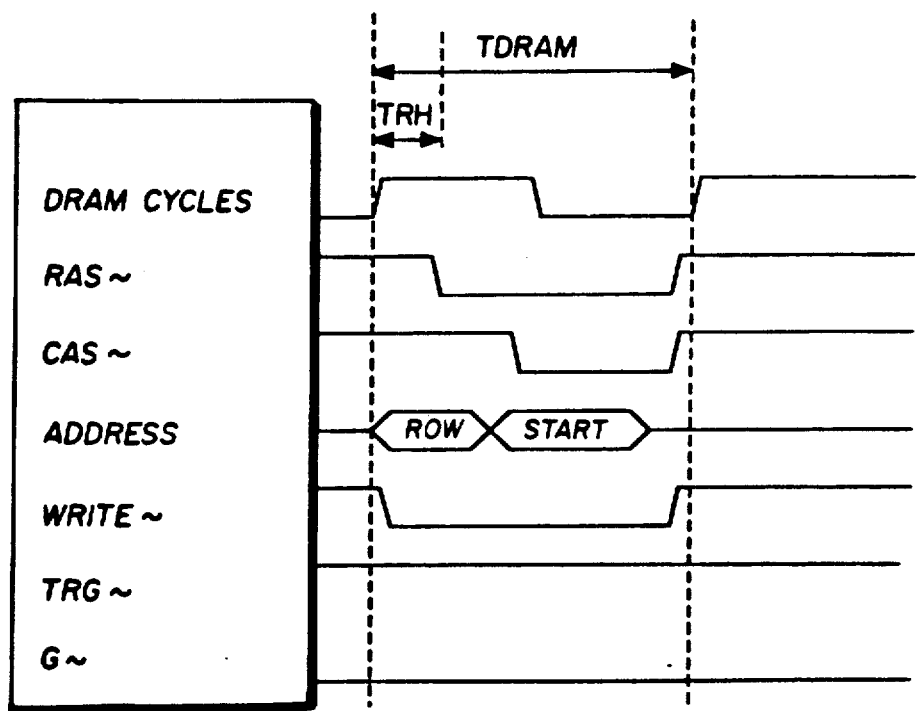
FIG. 23 is a timing diagram of a 'B' time slot, memory-to-internal shift register cycle.
Figure 24:
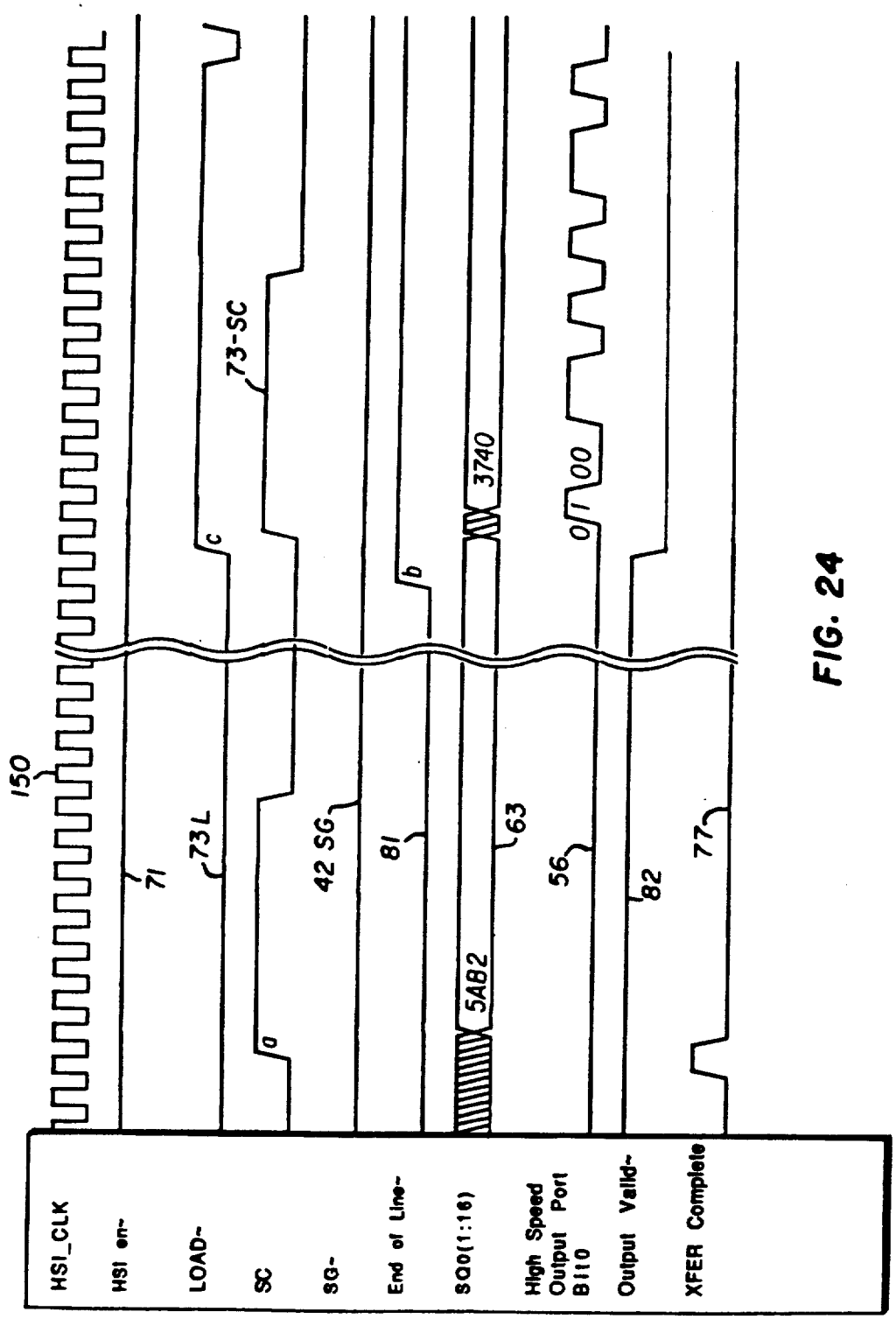
FIGS. 24-26 are timing diagrams associated with accessing the high speed port of the memory of FIG. 4 for reading out imagery data to a requesting device through the high speed interface unit of FIG. 16.
Figure 25:
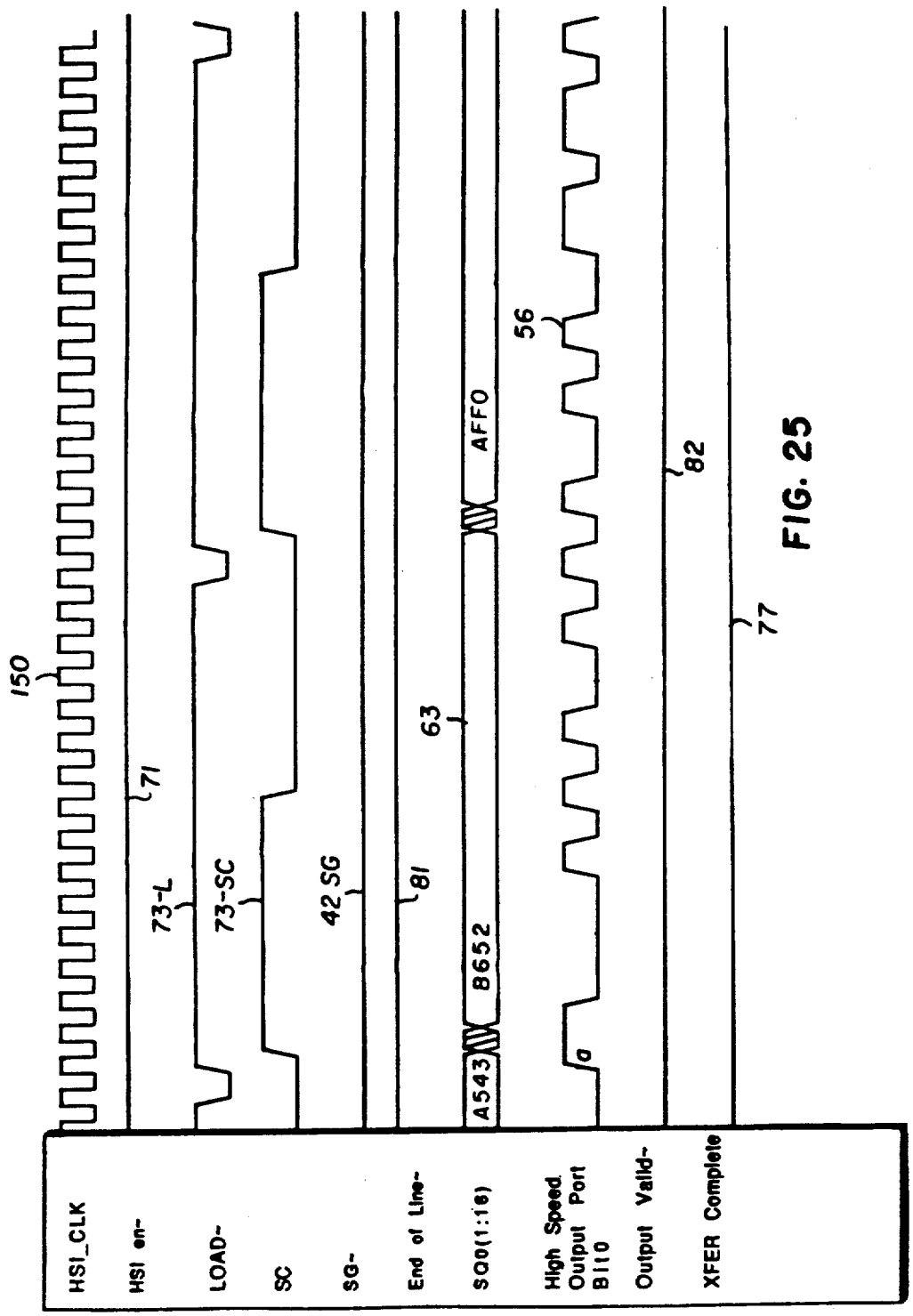
Figure 26:
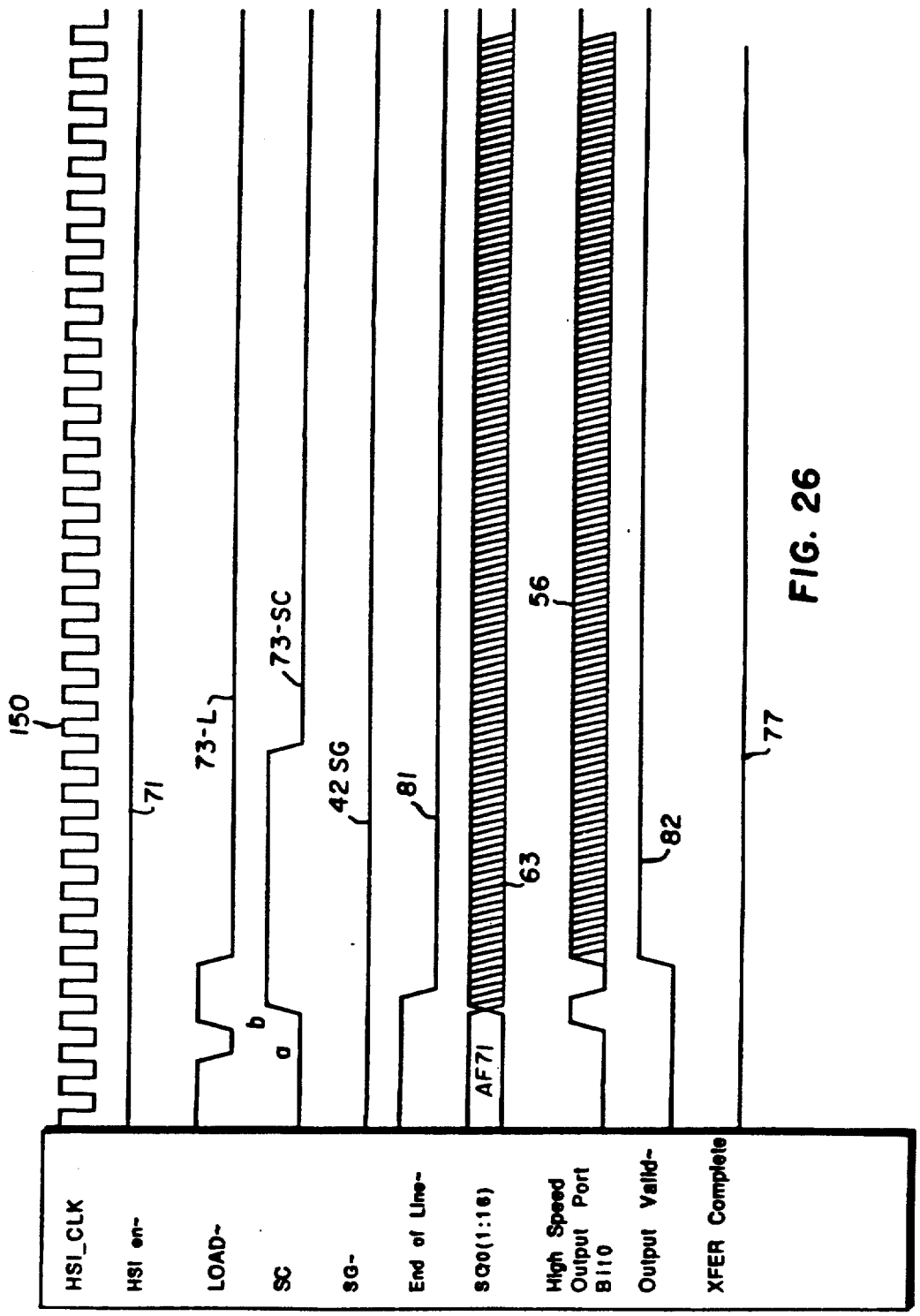

Access to the high speed port for reading out data to a requesting device is also accomplished through final shift register 51, but in accordance with the timing diagrams shown in FIGS. 23-26. More particularly, FIG. 23 shows the timing of a memory to internal shift register transfer cycle of memory array 10 during a 'B' time slot for a read mode of operation of the high speed port and FIGS. 24-26 show the timing of the operation of high speed interface 50.

Similar to the case of a medium speed read operation, in preparation for reading out a line or a frame of imagery data within memory array 10 to a requesting destination device, final shift register 51 is preloaded with the beginning (the first sixteen bits) of a line of data within the image memory array 10. For this purpose, when data is to be read out, an entire row of data is transferred from memory to its internal shift register. Upon completion of the transfer of a previous line of data, arbiter 30 will have asserted XFER complete on line 77 and then effected a transfer of a row of data from memory to internal shift register 115. In response to this signal, control unit 80 asserts serial clock SC high, causing the first stage of each internal shift register 115 to be placed on its associated line of bus 63, so that a group of sixteen pixel bits are valid on the data bus. Since the input to load port 157 is currently asserted low, the contents of bus 63 are loaded into register 51 by the high speed clock. In the example illustrated in FIG. 24, the first sixteen bits of data are encoded, in hexadecimal format, as 5AB2.

The outputting of data to a destination device from the high speed port is triggered by the destination device asserting end of line 81 high. In response to this high speed data request, at the next high speed clock, high speed port control unit 80 asserts a high on load line 73-L and a low on output valid line 82. The high on load line 73-L to final shift register 51 inhibits loading of the register. A low on output valid line 82 informs the requesting device that valid data is being clocked out over the serial output link 56. At the next falling edge of the high speed clock, serial clock SC is again asserted high to effect another serial shift of the internal registers 115. The first data bit is valid coincident with output valid line 82 going low. At the next high speed clock rising edge, the second bit of data is shifted out of register 51. Since load input port 157 is high, register 51 is in the serial shift (output) mode rather than in the parallel load mode. Therefore, with each high speed clock signal the contents of final shift register 51 are successively clocked out onto link 56 to the requesting destination device.

After the sixteenth bit has been clocked out of register 51, load line 81 is asserted low, thereby enabling the new contents of data bus 63 (3740 hex) to be parallel-loaded into register 51 at the next high speed clock pulse. The above sequence of events continues uninterrupted until the end of the line of data.

At the end of the line of data (FIG. 26), the requesting destination device causes end of line 81 to go low. When the last bit of data has been clocked out, high speed port control unit 80 asserts output valid line 82 high and asserts load port 157 to final shift register 51 in preparation for a new memory to internal shift register transfer of a new row of data.

CPU MEMORY ACCESS AND IRAM ARBITER CONTROL

Figure 1A:
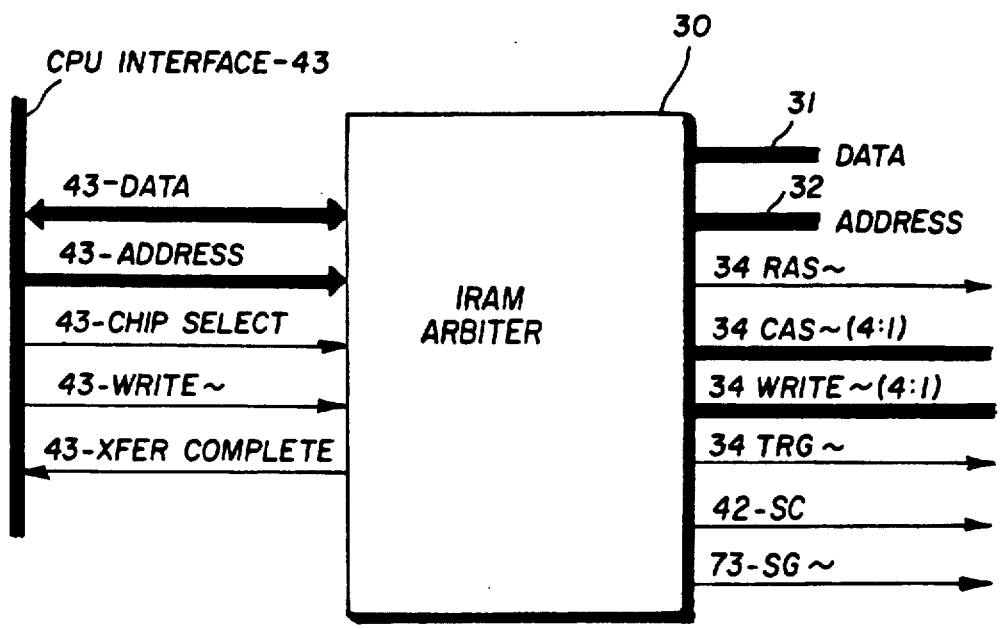
FIG. 1A is a diagrammatic illustration of an external processor to IRAM arbiter interface.

Access to the memories 10 by an external processor is controlled by the IRAM Arbiter 30. Referring to FIG. 1A, the CPU Interface 43 is composed of 43-data bus, 43-address bus, 43-chip select signal, 43-write~ signal and 43-XFER complete signal. Upon receiving 43-chip select true the IRAM Arbiter 30 decodes the additional address inputs 43-address and schedules a memory write or read cycle, depending upon the status of signal 43-write~. For a write cycle the state machine within the IRAM Arbiter schedules a CPU Memory Write Cycle, shown in FIG. 7 to take place during the next available 'B' Time Slot. The IRAM Arbiter also decodes additional 43-address lines to determine which 34-write~ (4:1) signals are to be activated, thereby providing a multiplexing function, in addition to allowing the external processor to write to individual pixels. 43-data bus is duplicated and enabled to provide data to data in/out bus 31. Upon completion of the CPU Memory Write Cycle the IRAM Arbiter notifies the external processor by asserting 43-XFER complete true until 43-chip select is taken away.

Upon receiving 43-chip select true with 43-write~ false, IRAM Arbiter 30 schedules a CPU Memory Read Cycle, shown in FIG. 12 to take place during the next available 'B' Time Slot. During the CPU Memory Read Cycle, the IRAM Arbiter also decodes additional 43-address lines to determine which pixel on data in/out bus 31 to multiplex to 43-data bus. Upon completion of the CPU Memory Read Cycle the IRAM Arbiter notifies the external processor by asserting 43-XFER complete until 43-chip select is false.

It will be recognized that control of the IRAM Arbiter may easily be facilitated by the same interface. Upon receiving 43-chip select true, the IRAM Arbiter 30 decodes the additional address inputs 43-address and writes or reads internal registers, depending upon the status of the 43-write~ signal. As mentioned previously, these internal registers may control the IRAM Arbiter. For instance, a bit within an internal register may control the IRAM Arbiter to start Medium Speed Port Read Cycles. Additional registers within the IRAM Arbiter may define the beginning and ending address for Medium Speed Port access. Additional registers within the IRAM Arbiter 30 may define the beginning and ending row for High Speed access. If signal 43-write~ signal is false upon the receipt of 43-chip select true, then, depending on the state of 43-address lines, status registers within the IRAM Arbiter may be interrogated by the external processor.

The foregoing is only a representative example of the methods available for accessing and controlling the Dual Port Dual Speed Image Memory by an external processor. Reading and writing into Memory 10 may be facilitated indirectly by IRAM Arbiter 30. An internal address register may be used to specify the next location in memory array 10 to be accessed. The IRAM Arbiter may then prefetch the data at that address and temporarily store the data in an internal status register. When the external processor reads the internal status register, IRAM Arbiter 30 may automatically schedule the reading of the next memory location. The IRAM Arbiter 30 may control the indexing of the internal address register. If the external processor writes to the internal status register then the IRAM Arbiter automatically schedules a CPU Memory Write Cycle, to transfer the data from the internal status register to the memory array 10 using the address in the internal address register.

As will be appreciated from the foregoing description, the dual port, dual speed interface of the present invention provides a mechanism for enabling stored imagery data to be accessed and displayed at the same time that a new image is being received, or during separate times, and at either the same or different data rates. Through the use of a controlled medium speed multiplexer and high speed shift register interface, the dual port memory can be simultaneously accessed through each port without the need to switch between a pair of image memory buffers, and blank a destination monitor while the next (incoming) image is being recorded. Namely, no additional or redundant storage facility is required and the transfer of the contents of the image memory to an output (e.g. display) device need not be inhibited until loading of the new image is complete.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

I claim:

1. A digital data storage and retrieval arrangement for controllably storing digital data signals having a data rate which is any selected one of a plurality of data rates and outputting digital data signals at a data rate which is any selected one of said plurality of data rates, the arrangement comprising, in combination:

a digital data memory;

a first input/output port, coupled to the digital data memory, for receiving first serial input digital data signals at a first data rate and writing said first digital data signals into said digital data memory, and for reading out digital data signals from said digital data memory as first serial output digital data signals at said first data rate;

a second input/output port, coupled to the digital data memory, for receiving second serial input digital data signals at a second data rate, different from said first data rate, and writing said second digital data signals into said digital data memory, and for reading out digital data signals from said digital data memory as second serial output digital data signals at said second data rate; and control means, coupled to said first and second input/output ports, for enabling said first and second input/output ports to interface digital data signals with said digital data memory independently of one another, so that digital data signals which have been written into said digital data memory may be read out therefrom at either of said first or second data rates regardless of a data rate at which digital data signals were supplied for storage in said digital data memory.

2. A digital storage and retrieval arrangement according to claim 1, wherein said digital data memory contains a plurality N of random access memories, each of which contains an array of storage locations, each storage location being individually addressable for data access, and also addressable in respective groups of M storage locations for data access, said first input/output port includes means for receiving first serial input digital data signals at said first data rate and writing respective ones of said first digital data signals into storage locations of respective ones of said plurality of N memories, and for reading out digital data signals from storage locations of said plurality of N memories as first serial output digital data signals at said first data rate, and said second input/output port includes means for receiving second serial input digital data signals at said second data rate, and writing respective ones of said second digital data signals into storage locations of respective ones of said plurality of N memories, and for reading out digital data signals from storage locations of said plurality of N memories as second serial output digital data signals at said second data rate, wherein M and N are integers greater than or equal to one.

3. A digital data storage and retrieval arrangement according to claim 1, wherein a data rate of digital data signals that are interfaced with said digital data memory by said second input/output port is higher than the data rate of digital data signals that are interfaced with said digital data memory by said first input/output port.

4. A digital data storage and retrieval arrangement according to claim 3, wherein said digital data memory contains a plurality N of random access memories, each of which contains an array of storage locations, each storage location being individually addressable for data access, and also addressable in respective groups of M storage locations for data access, said first input/output port includes first means for receiving first serial input digital data signals at said first data rate and writing respective ones of said first digital data signals, in parallel, into storage locations of respective ones of said plurality of N memories, and second means for reading out, in parallel, digital data signals from storage locations of respective ones of said plurality of N memories, and outputting digital data signals which have been read out as said first serial output digital data signals at said first data rate, wherein M and N are integers greater than or equal to one.

5. A digital data storage and retrieval arrangement according to claim 4, wherein said second input/output port includes means for receiving second serial input digital data signals at said second data rate, and writing respective groups of second digital data signals into groups of M storage locations of respective ones of said plurality of N memories, and for reading out digital data signals from groups of M storage locations of said plurality of N memories and outputting digital data signals which have been read out as said second serial output digital data signals at said second data rate.

6. A digital data storage and retrieval arrangement according to claim 3, wherein said digital data memory contains a plurality N of random access memories, each of which contains an array of rows and columns of storage locations, each storage location in an array being individually addressable for data access via at least one of said first and second input/output ports, said first input/output port includes first means for receiving first serial input digital data signals at said first data rate and writing respective ones of said first digital data signals, in parallel, into storage locations of respective ones of said plurality of N memories, and second means for reading out, in parallel, digital data signals from storage locations of respective ones of said plurality of N memories, and outputting digital data signals which have been read out as said first serial output digital data signals at said first data rate, wherein M and N are integers greater than or equal to one.

7. A digital data storage and retrieval arrangement according to claim 6, wherein said first means includes a temporary input buffer into successive storage locations of which respective successive ones of said first serial input digital data signals are serially loaded as said first serial input digital data signals are received at said first data rate, and from successive storage locations of which previously loaded input digital data signals are thereafter transferred, in parallel, into storage locations of respective ones of said plurality of N memories of said digital data memory.

8. A digital data storage and retrieval arrangement according to claim 7, wherein said second means includes a temporary output buffer into respective storage locations of which digital data signals that have been read out, in parallel, from storage locations of respective ones of said plurality of N memories, are loaded and thereafter serially clocked out as said first serial output digital data signals at said first data rate.

9. A digital data storage and retrieval arrangement according to claim 6, wherein the storage locations of a respective random access memory are addressable for data access a row at a time, and said second input/output port includes means for receiving second serial input digital data signals at said second data rate, and writing respective groups of second digital data signals into associated rows of storage locations of respective ones of said plurality of N memories, and for reading out digital data signals from respective rows of storage locations of said plurality of N memories and outputting digital data signals which have been read out as said second serial output digital data signals at said second data rate.

10. A digital data storage and retrieval arrangement according to claim 9, wherein each of said plurality of N memories has a first shift register, having a capacity which accommodates a number of storage locations in a row of said array, and respective stages of which are controllably interfaced in parallel with respective storage locations of each row of said each memory, and which are externally accessible in serial format, and wherein said second input/output port includes a second shift register for receiving second serial input digital data signals at said second data rate, and controllably transferring contents of respective stages thereof, in parallel, to serial inputs of N respective first shift registers of said N memories, contents of said N first shift registers being controllably transferable into respective rows of storage locations of respective ones of said plurality of N memories, for second serial input digital data signals to be stored in said digital data memory, and being controllably serially shifted out, a stage at a time, and transferred, in parallel, into N respective stages of said second shift register, respective stages of which are controllably clocked out as said second serial output digital data signals at said second data rate.

11. A data storage and retrieval arrangement according to claim 1, wherein said control means comprises means for controllably enabling said first and second input/output ports to interface digital data signals with said digital data memory during alternate memory cycles of said digital data memory.

12. A data storage and retrieval arrangement according to claim 1, wherein said control means includes means for reserving prescribed memory cycles of said digital data memory during which said first input/output port is permitted to interface digital data signals with said digital data memory at said first data rate.

13. A digital data storage and retrieval arrangement according to claim 12, wherein said control means includes means for reserving every other memory cycle of said digital data memory for read or write operations at said first data rate during which said first input/output port is permitted to interface digital data signals with said digital data memory at said first data rate.

14. A data storage and retrieval arrangement according to claim 12, wherein said second input/output port includes means for receiving digital data signals having said second data rate for storage in said memory during times of occurrence of successive memory cycles of said memory.

15. A data storage and retrieval arrangement according to claim 14, wherein said second input/output port includes means for transferring digital data signals, having said second data rate, with respect to said memory during memory cycles that occur at times that are interleaved with respect to times of occurrence of said every other memory cycle.

16. A data storage and retrieval arrangement according to claim 15, wherein said control means includes means for clocking out digital data signals having said second data rate from said second input/output port during times of occurrence of successive memory cycles of said memory.

17. A digital data storage and retrieval arrangement according to claim 16, wherein said digital data memory contains a plurality N of random access memories, each of which contains an array of rows and colums of storage locations, and wherein the storage locations of a respective random access memory are addressable for data access a row at a time, and said second input/output port includes means for receiving second serial input digital data signals at said second data rate, and writing respective groups of second digital data signals into associated rows of storage locations of respective ones of said plurality of N memories, and for reading out digital data signals from respective rows of storage locations of said plurality of N memories and outputting digital data signals which have been read out as said second serial output digital data signals at said second data rate, and wherein each of said plurality of N memories has a first shift register, having a capacity which accommodates a number of storage locations in a row of said array, and respective stages of which are controllably interfaced in parallel with respective storage locations of each row of said each memory, and which are externally accessible in serial format, and wherein said second input/output port includes a second shift register for receiving second serial input digital data signals at said second data rate, and controllably transferring contents of respective stages thereof, in parallel, to serial inputs of N respective first shift registers of said N memories, contents of said N first shift registers being controllably transferable into respective rows of storage locations of respective ones of said plurality of N memories, for second serial input digital data signals to be stored in said digital data memory, and being controllably serially shifted out, a stage at a time, and transferred, in parallel, into N respective stages of said second shift register, respective stages of which are controllably clocked out as said second serial output digital data signals at said second data rate, and wherein said control means includes means for transferring data between rows of said N memories and said second shift register during memory cycles that occur at times that are interleaved with respect to times of occurrence of said every other memory cycle, wherein M and N are integers greater than or equal to one.

18. A digital data storage and retrieval arrangement for controllably storing first serial digital data signals having a first data rate and second serial digital data signals having a second data rate and controllably outputting serial digital data signals at each of said data rates, said second data rate being higher than said first data rate, the arrangement comprising, in combination:

a dynamic random access digital data memory;

a first input/output port, coupled to the digital data memory, for receiving first serial input digital data signals at said first data rate and controllably writing said first digital data signals into said memory, and for controllably reading out digital data signals from said memory as first serial output digital data signals at said first data rate;

a second input/output port, coupled to the digital data memory, for receiving second serial input digital data signals at said second data rate and controllably writing said second digital data signals into said memory, and for controllably reading out digital data signals from said memory as second serial output digital data signals at said second data rate; and control means, coupled to said first and second input/output ports, for controllably enabling said first input/output port to interface digital data signals having said first data rate with said memory during every other one of first successive memory cycles of said memory, and for controllably enabling said second input/output port to interface digital data signals having said second data rate with said memory during second memory cycles of said memory, times of occurrence of which are interleaved with said first successive memory cycles.

19. A digital storage and retrieval arrangement according to claim 18, wherein said memory contains a plurality N of dynamic random access memory arrays, each of which contains plural rows and columns of storage locations, each storage location being individually addressable for data access, and also addressable for data access a row at a time, said first input/output port includes first means for receiving first serial input digital data signals at said first data rate and controllably writing respective ones of said first digital data signals into storage locations of respective ones of said plurality of N memory arrays and second means for reading out digital data signals from storage locations of said plurality of N memory arrays as first serial output digital data signals at said first data rate, and said second input/output port includes third means for receiving second serial input digital data signals at said second data rate, and writing respective ones of said second digital data signals into storage locations of respective ones of said plurality of N memory arrays, and for reading out digital data signals from storage locations of said plurality of N memory arrays, as second serial output digital data signals at said second data rate, wherein N is an integer greater than or equal to one.

20. A digital data storage and retrieval arrangement according to claim 19, wherein said first means includes a temporary input buffer into successive storage locations of which respectively successive ones of said first serial input digital data signals are serially loaded as said first serial input digital data signals are received at said medium data rate, and from successive storage locations of which previously loaded input digital data signals are thereafter transferred, in parallel, into storage locations of respective ones of said plurality of N memory arrays of said memory.

21. A digital data storage and retrieval arrangement according to claim 20, wherein said second means includes a temporary output buffer into respective storage locations of which digital data signals that have been read out, in parallel, from storage locations of respective ones of said plurality of N memory arrays, are loaded and thereafter serially clocked out as said first serial output digital data signals at said first data rate.

22. A digital data storage and retrieval arrangement according to claim 19, wherein said third means includes means for receiving second serial input digital data signals at said second data rate, and writing respective groups of second digital data signals into associated rows of storage locations of respective ones of said plurality of N memory arrays, and for reading out digital data signals from respective rows of storage locations of said plurality of N memory arrays and outputting which have been read out digital data signals as said second serial output digital data signals at said second data rate.

23. A digital data storage and retrieval arrangement according to claim 22, wherein each of said plurality of N memory arrays has a first shift register, having a capacity which accommodates a number of storage locations in a row of said each memory array, and respective stages of which are controllably interfaced in parallel with respective storage locations of each row of said each memory array, and which are externally accessible in serial format, and wherein said second input/output port includes a second shift register for receiving second serial input digital data signals at said second data rate, and controllably transferring contents of respective stages thereof, in parallel, to serial inputs of N respective first shift registers of said N memory arrays, contents of said N first shift registers being controllably transferable into respective rows of storage locations of respective ones of said plurality of N memory arrays, for second serial input digital data signals to be stored in said memory, and being controllably serially shifted out, a stage at a time, and transferred, in parallel, into N respective stages of said second shift register, respective stages of which are controllably clocked out as said second serial output digital data signals at said second data rate.

24. A data storage and retrieval arrangement according to claim 18, wherein said control means includes means for reserving every other memory cycle of said digital data memory for read or write operations at said first data rate during which said first input/output port is permitted to interface digital data signals with said digital data memory at said first data rate.

25. A data storage and retrieval arrangement according to claim 24, wherein said second input/output port includes means for transferring digital data signals, having said second data rate, with respect to said memory during said second memory cycles.

26. A digital data storage and retrieval arrangement according to claim 25, wherein said digital data memory contains a plurality N of random access memories, each of which contains an array of rows and columns of storage locations, and wherein the storage locations of a respective random access memory are addressable for data access a row at a time, and said second input/output port includes means for receiving second serial input digital data signals at said second data rate, and writing respective groups of second digital data signals into associated rows of storage locations of respective ones of said plurality of N memories, and for reading out digital data signals from respective rows of storage locations of said plurality of N memories and outputting digital data signals which have been read out as said second serial output digital data signals at said second data rate, and wherein each of said plurality of N memories has an associated first shift register, having a capacity which accommodates a number of storage locations in a row of said array, and respective stages of which are controllably interfaced in parallel with respective storage locations of each row of said each memory, and which are externally accessible in serial format, and wherein said second input/output port includes a second shift register for receiving second serial input digital data signals at said second data rate, and controllably transferring contents of respective stages thereof, in parallel, to serial inputs of N respective first shift registers of said N memories, contents of said N first shift registers being controllably transferable into respective rows of storage locations of respective ones of said plurality of N memories, for second serial input digital data signals to be stored in said digital data memory, and being controllably serially shifted out, a stage at a time, and transferred, in parallel, into N respective stages of said second shift register, respective stages of which are controllably clocked out as said second serial output digital data signals at said second data rate, and wherein said control means includes means for transferring data between rows of said N memories and said second shift register during said second memory cycles, wherein M and N are integers greater than or equal to one.

27. A method of storing digital imagery data, a data rate of which may be any one of a plurality of data rates and outputting digital imagery data at a data rate which is any selected one of said plurality of data rates, the method comprising the steps of:

(a) providing a digital data memory array which contains a plurality N of random access memories, each of which contains an array of storage locations, each storage location being individually accessible through a first data rate, and also accessible, through a second bidirectional data port, in respective groups of M storage locations for data access at a second data rate, higher than said first data rate, M and N being integers greater than or equal to one;

(b) storing first input imagery data signals having said first data rate by temporarily buffering said first input imagery data signals through a first input-/output port and writing temporarily buffered first input data signals in groups of N input imagery data signals into respective ones of the N memories of said digital data memory during prescribed alternate memory cycles of said digital data memory;

(c) retrieving previously stored imagery data signals at said first data rate by reading out digital data signals in groups of N signals in parallel from the N memories of said digital data memory and clocking out successive groups of read out N first signals as first serial output digital data signals at said first data rate;

(d) storing second input data signals having said second data rate by temporarily buffering said second input imagery data signals through a second input-/output port and writing respective ones of said second digital data signals, in groups, into internal storage registers corresponding with pluralities of M storage locations of respective ones of said plurality of N memories, as said second input imagery data signals are being received from an imagery data source, and transferring pluralities of second input data signals that have been in written into said internal storage registers of said N memories into respective ones of the N memories of said digital data memory during memory cycles other than said alternate memory cycles; and (e) retrieving previously stored imagery data signals at said second data rate by transferring pluralities of imagery data signals, that have been in written into the N memories of said digital data memory, into said internal storage registers during memory cycles other than said alternate memory cycles, and then clocking out digital data signals from said internal storage registers, in groups, to said second input/output port and serially outputting said groups as second serial output digital data signals at said second data rate.

28. A method according to claim 27, wherein said other memory cycles occur at times that are interleaved with respect to times of occurrence of said prescribed alternate memory cycles.

* * * * *